(12) United States Patent
Kim et al.

(10) Patent No.: US 9,972,803 B2
(45) Date of Patent: May 15, 2018

(54) CARBAZOLE-BASED COMPOUND AND ORGANIC LIGHT EMITTING DIODE INCLUDING THE SAME

(71) Applicant: SAMSUNG DISPLAY CO., LTD., Yongin, Gyeonggi-do (KR)

(72) Inventors: Seul-Ong Kim, Yongin (KR); Dong-Woo Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 923 days.

(21) Appl. No.: 13/971,799

(22) Filed: Aug. 20, 2013

(65) Prior Publication Data
US 2014/0191208 A1    Jul. 10, 2014

(30) Foreign Application Priority Data

Jan. 4, 2013  (KR) .................. 10-2013-0001311

(51) Int. Cl.
*H01L 51/50* (2006.01)
*H01L 51/00* (2006.01)

(52) U.S. Cl.
CPC ...... *H01L 51/5088* (2013.01); *H01L 51/0052* (2013.01); *H01L 51/0054* (2013.01); *H01L 51/0067* (2013.01); *H01L 51/0072* (2013.01); *H01L 51/0059* (2013.01);
(Continued)

(58) Field of Classification Search
CPC .................................................. H01L 51/0054
See application file for complete search history.

(56) References Cited

U.S. PATENT DOCUMENTS

2012/0235123 A1*  9/2012  Lee ................... H01L 51/0072
257/40

FOREIGN PATENT DOCUMENTS

| JP | 3139321 | 12/2000 |
|---|---|---|
| KR | 10-2011-0015836 | 2/2011 |
| KR | 20-2012-0030009 | 3/2012 |

(Continued)

OTHER PUBLICATIONS

Patent Abstracts of Japan, Publication No. 1996-003547, dated Jan. 9, 1996 for corresponding Japanese Patent 3139321.

*Primary Examiner* — Alex A Rolland
(74) *Attorney, Agent, or Firm* — Lewis Roca Rothgerber Christie LLP

(57) ABSTRACT

A carbazole-based compound is represented by Formula 1 and may be used in the organic layer of an organic light-emitting diode. An organic light-emitting diode includes a first electrode, a second electrode, and an organic layer between the first and second electrodes. The organic layer includes an emission layer, and the carbazole-based compound of Formula 1 may be included in the emission.

Formula 1

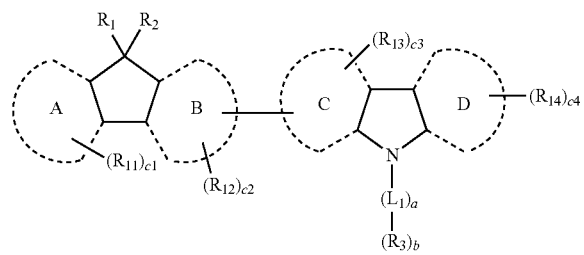

17 Claims, 1 Drawing Sheet

(52) U.S. Cl.
CPC ...... *H01L 51/0081* (2013.01); *H01L 51/0085* (2013.01); *H01L 51/5016* (2013.01)

(56) References Cited

FOREIGN PATENT DOCUMENTS

KR  10-2012-0031684    4/2012
WO  WO2012/036482 A1  3/2012

* cited by examiner

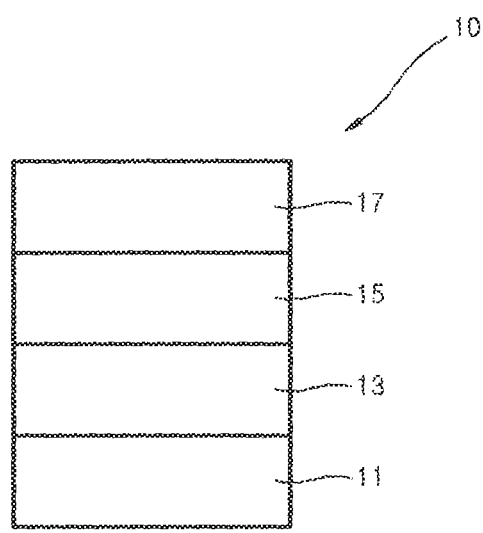

CARBAZOLE-BASED COMPOUND AND ORGANIC LIGHT EMITTING DIODE INCLUDING THE SAME

CROSS-REFERENCE TO RELATED PATENT APPLICATION

This application claims priority to and the benefit of Korean Patent Application No. 10-2013-0001311, filed on Jan. 4, 2013 in the Korean Intellectual Property Office, the entire content of which is incorporated herein by reference.

BACKGROUND

1. Technical Field

The present invention relates to a carbazole-based compound and an organic light-emitting diode including the same.

2. Description of the Related Art

Organic light-emitting diodes (OLEDs) are self-emitting devices having advantages such as a wide viewing angle, good contrast, quick response speeds, high brightness, and good driving voltage characteristics. Also, OLEDs can provide multicolored images.

A typical organic light-emitting diode has a structure including a substrate, and an anode, a hole transport layer (HTL), an emission layer (EML), an electron transport layer (ETL), and a cathode sequentially stacked on the substrate. In this regard, the HTL, the EML, and the ETL are organic thin films formed of organic compounds.

An operating principle of an organic light-emitting diode having the above-described structure is as follows. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY OF THE INVENTION

Embodiments of the present invention are directed to a novel carbazole-based compound and an organic light-emitting diode including the carbazole-based compound.

According to an aspect of the present invention, a carbazole-based compound is represented by Formula 1 below:

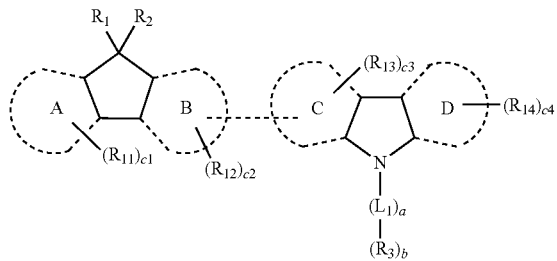

<Formula 1>

In Formula 1, ring A, ring B, ring C, and ring D may be each independently a benzene ring, a naphthalene ring, an anthracene ring, a phenanthrene ring, a pyrene ring, a pyridine ring, a pyrimidine ring, or a pyrazine ring, except that ring A, ring B, ring C, and ring D are not all benzene rings.

$L_1$ may be a substituted or unsubstituted $C_3$-$C_{10}$ cycloalkylene group, a substituted or unsubstituted $C_3$-$C_{10}$ heterocycloalkylene group, a substituted or unsubstituted $C_2$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

a may be an integer from 0 to 5.

$R_1$ and $R_2$ may be each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

$R_3$ and $R_{11}$ to $R_{14}$ may be each independently a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, $-N(Q_1)(Q_2)$ or $-Si(Q_3)(Q_4)(Q_5)$.

$Q_1$ to $Q_5$ may be each independently a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group.

b may be an integer from 1 to 5.

c1, c2, c3, and c4 may be each independently an integer from 1 to 8.

According to another aspect of the present invention, an organic light-emitting diode includes a first electrode, a second electrode facing the first electrode, and an organic layer including an emission layer between the first electrode and the second electrode. The organic layer includes at least one carbazole-based compound represented by Formula 1.

BRIEF DESCRIPTION OF THE DRAWINGS

The above and other features and advantages of the present invention will become more apparent by reference to the following detailed description when considered in conjunction with the attached drawing in which:

FIG. 1 is a schematic cross-sectional view of an organic light-emitting diode according to an embodiment of the present invention.

DETAILED DESCRIPTION OF THE INVENTION

Hereinafter, the present invention will be described with reference to the accompanying drawing, in which an exemplary embodiment of the invention is shown. As used herein, the term "and/or" includes any and all combinations of one or more of the associated listed items. Expressions such as "at least one of," when preceding a list of elements, modify the entire list of elements and do not modify the individual elements of the list.

A carbazole-compound according to an embodiment of the present invention is represented by Formula 1 below:

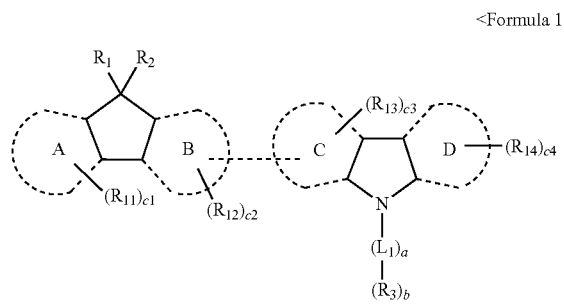

<Formula 1>

In Formula 1, ring A, ring B, ring C, and ring D may be each independently a benzene ring, a naphthalene ring, an anthracene ring, a phenanthrene ring, a pyrene ring, a pyridine ring, a pyrimidine ring, or a pyrazine ring, except that ring A, ring B, ring C, and ring D are not all benzene rings.

For example, ring A, ring B, ring C, and ring D may be each independently a benzene ring or a naphthalene ring, except that ring A, ring B, ring C, and ring D are not all benzene rings. In Formula 1, $R_{11}$, $R_{12}$, $R_{13}$ and $R_{14}$ each independently represent substituents of ring A, ring B, ring C, and ring D, respectively.

In Formula 1, $L_1$ may be a substituted or unsubstituted $C_3$-$C_{10}$ cycloalkylene group, a substituted or unsubstituted $C_3$-$C_{10}$ heterocycloalkylene group, a substituted or unsubstituted $C_2$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

For example, $L_1$ may be a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinyiene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, or a substituted or unsubstituted benzocarbazolyl group, but $L_1$ is not limited thereto.

In Formula 1, $L_1$ may be:
a phenylene group, a pentalenylene group, an indenylene group, a naphthylene group, an azulenylene, a heptalenylene group, an indacenylene group, an acenaphthylene group, a fluorenylene group, a spiro-fluorenylene group, a phenalenylene group, a phenanthrenylene group, an anthrylene group, a fluoranthenylene, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, or a benzocarbazolyl group; or a phenylene group, a pentalenylene group, an indenylene group, a naphthylene group, an azulenylene, a heptalenylene group, an indacenylene group, an acenaphthylene group, a fluorenylene group, a spiro-fluorenylene group, a phenalenylene group, a phenanthrenylene group, an anthrylene group, a fluoranthenylene, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, or a benzocarbazolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a dimethylfluorenyl group, a diphenylfluorenyl group, a spirofluorenyl group, a phenylcarbazolyl group, or —N($Q_{11}$)($Q_{12}$), where $Q_{11}$ and $Q_{12}$ are each independently a hydrogen atom, a $C_1$-$C_{10}$ alkyl group, a $C_6$-$C_{20}$ aryl group, or a $C_2$-$C_{20}$ heteroaryl group.

According to an embodiment of the present invention, in Formula 1, $L_1$ may be:

i) a phenylene group, a naphthylene group, a fluorenylene group, a pyridinylene group, a pyrazinylene group, a pyrimidinylene group, a pyridazinylene group, a quinolinylene group, an isoquinolinylene group, a phenanthridinylene group, a carbazolylene group, a triazinylene group, a dibenzofuranylene group, or a dibenzothiophenylene group; or ii) a phenylene group, a naphthylene group, a fluorenylene group, a pyridinylene group, a pyrazinylene group, a pyrimidinylene group, a pyridazinylene group, a quinolinylene group, an isoquinolinylene group, a phenanthridinylene group, a carbazolylene group, a triazinylene group, a dibenzofuranylene group, or a dibenzothiophenylene group, each of which is substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{20}$ alkyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

In Formula 1, a refers to the number of $L_1$ groups and is an integer from 0 to 5. When $L_1$ is 0, $R_3$ may be directly bound to a nitrogen of the carbazole ring of the compound of Formula 1. a may be 1, but is not limited thereto. When a is 2 or greater, the two or more $L_1$ groups may the same or different from each other.

In Formula 1, $R_1$ and $R_2$ may be each independently a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

According to an embodiment of the present invention, $R_1$ and $R_2$ may be each independently:

a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each of which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group.

For example, $R_1$ and $R_2$ may be each independently:

a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group, each of which is substituted with at least one of a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; but $R_1$ and $R_2$ are not limited thereto.

In Formula 1, $R_3$ may be:

a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{20}$ alkoxy group; or a $C_1$-$C_{10}$ alkyl group or a $C_1$-$C_{20}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or a phenyl group, a pentalenylene group, an indenyl group, a naphthyl group, an azulenyl group, a heptalenyl group, an indacenyl, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, a benzocarbazolyl group, or an isoquinolyl group; or a phenyl group, a pentalenylene group, an indenyl group, a naphthyl group, an azulenyl group, a heptalenyl group, an indacenyl, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, a benzocarbazolyl group, or an isoquinolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, or a $C_2$-$C_{60}$ heteroaryl group.

For example, $R_3$ may be:

a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{20}$ alkoxy group; or a $C_1$-$C_{10}$ alkyl group or a $C_1$-$C_{20}$ alkoxy group, each or which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group; or a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, an isoquinolyl group, or a dimethylfluorenyl group; but $R_3$ is not limited thereto.

In Formula 1, the group represented by

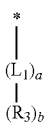

may be one selected from Formulae 2-1 to 2-7 below:

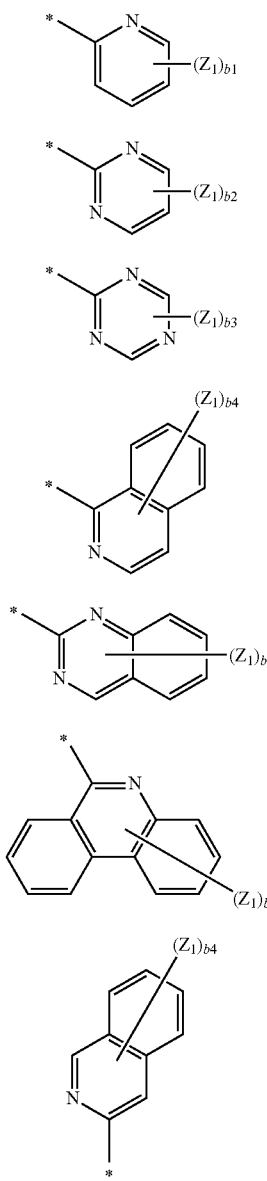

Formula 2-1

Formula 2-2

Formula 2-3

Formula 2-4

Formula 2-5

Formula 2-6

Formula 2-7

In Formulae 2-1 to 2-7, $R_3$ is as described above with respect to Formula 1.

For example, in Formulae 2-1 to 2-7, $R_3$ may be:

a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{20}$ alkoxy group; or a $C_1$-$C_{10}$ alkyl group or a $C_1$-$C_{20}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group; or a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, an isoquinolyl group, or a dimethylfluorenyl group; but $R_3$ is not limited thereto.

In Formulae 2-1 to 2-7, b1 is an integer from 1 to 4, b2 is an integer from 1 to 3, b3 is an integer from 1 to 2, b4 is an integer from 1 to 6, and b5 is an integer from 1 to 5.

For example, in Formula 1, the group represented by

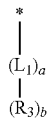

may be selected from Formulae 3-1 to 3-14 below, but is not limited thereto:

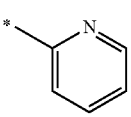

Formula 3-1

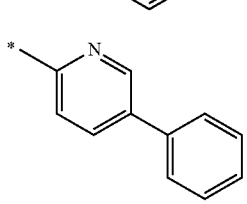

Formula 3-2

Formula 3-3
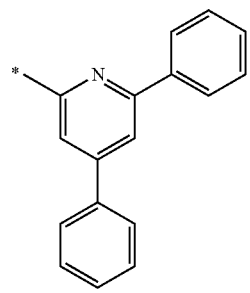

Formula 3-4
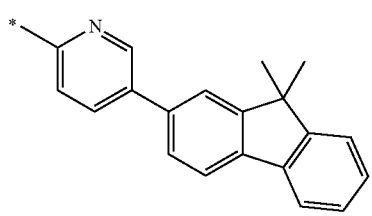

Formula 3-5
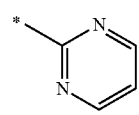

Formula 3-6
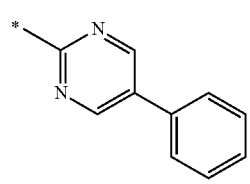

Formula 3-7
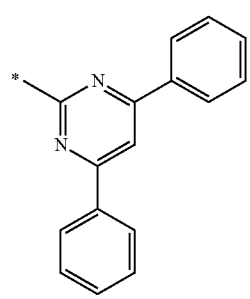

Formula 3-8
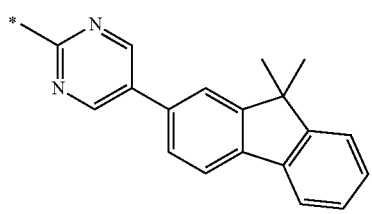

Formula 3-9
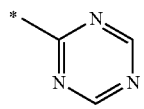

Formula 3-10
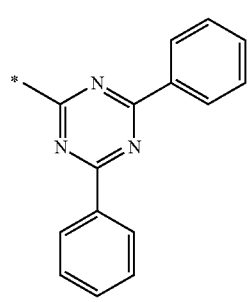

Formula 3-11
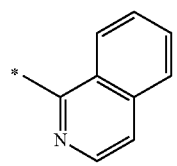

Formula 3-12
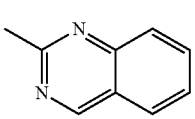

Formula 3-13
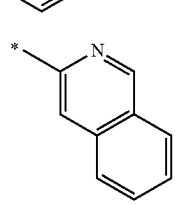

Formula 3-14

In Formula 1, $R_{11}$ to $R_{14}$ may be each independently:

a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each of which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group; but $R_{11}$ to $R_{14}$ are not limited thereto.

According to an embodiment of the present invention, the carbazole-based compound may be a compound represented by one of Formulae 1A to 1H below:

<Formula 1A>

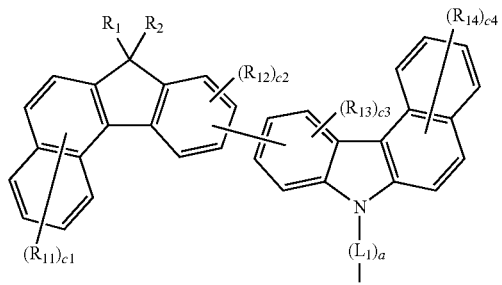

<Formula 1B>

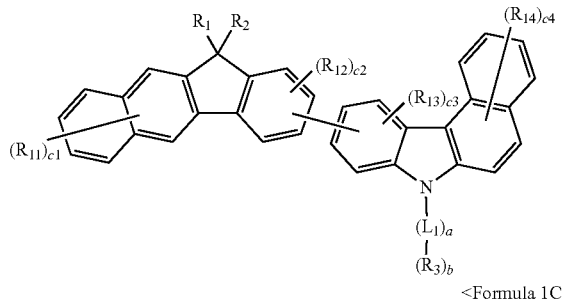

<Formula 1C>

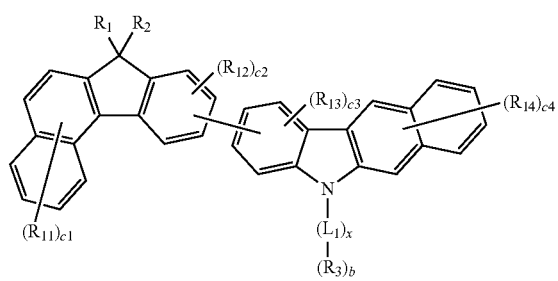

<Formula 1D>

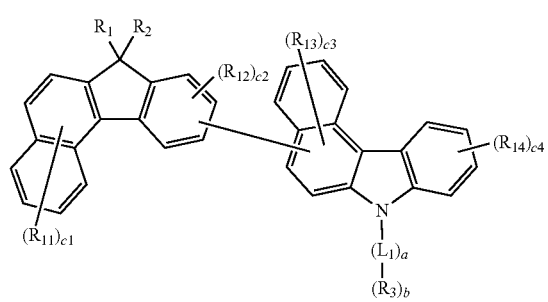

<Formula 1E>

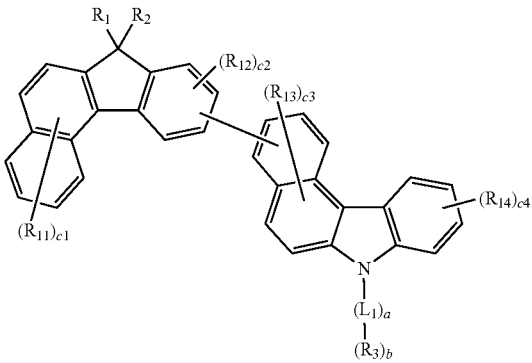

<Formula 1F>

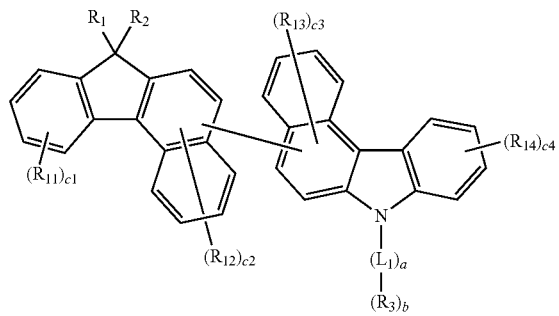

<Formula 1G>

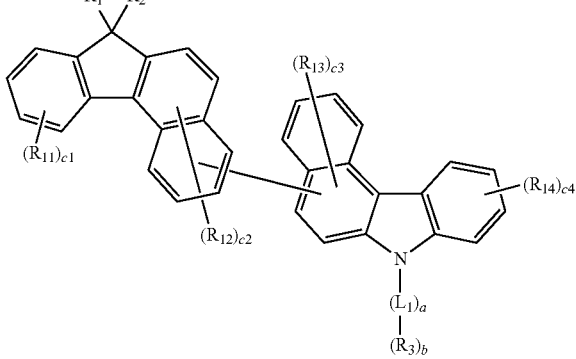

<Formula 1H>

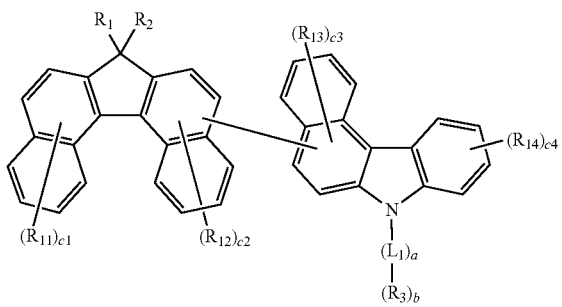

In Formulae 1A to 1H, $L_1$, a, $R_1$ to $R_3$, b, $R_{11}$ to $R_{14}$, $c_1$, $c_2$, $c_3$, $c_4$ and

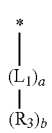
are as described above with respect to Formula 1.
According to another embodiment of the present invention, the carbazole-based compound may be represented by Formula 1A(1), 1A(2), 1A(3), 1B(1), 1C(1), 1D(1), 1E(1), 1F(1), 1G(1), or 1H(1) below, but is not limited thereto:
<Formula 1A(1)>
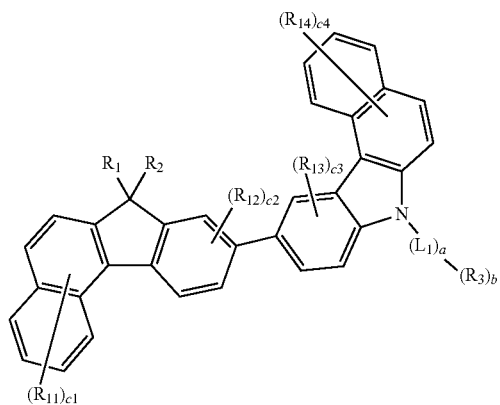
<Formula 1A(2)>
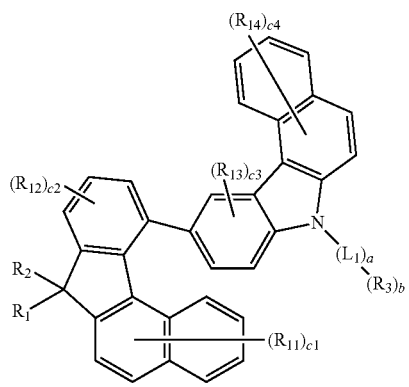
<Formula 1A(3)>
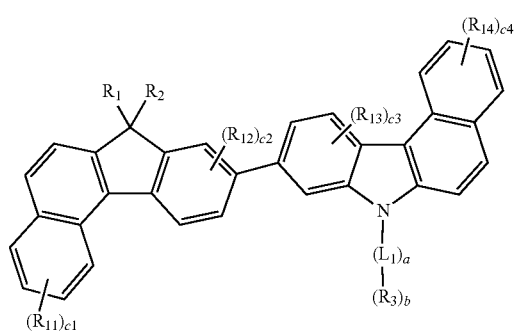
<Formula 1B(1)>
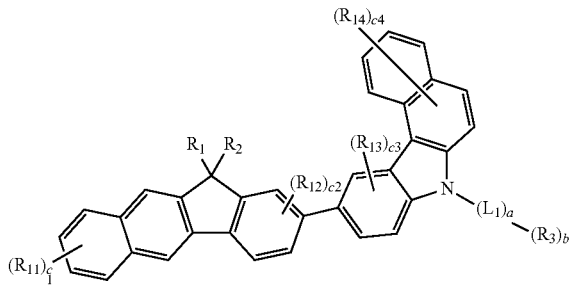
<Formula 1C(1)>
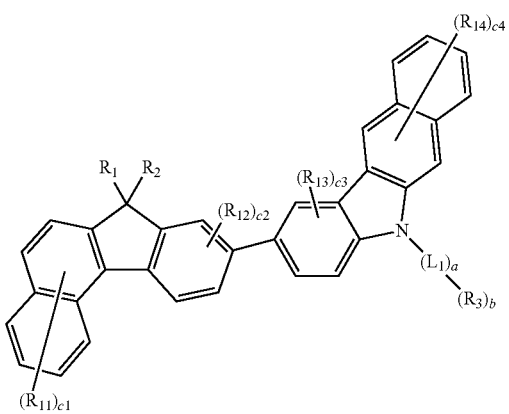
<Formula 1D(1)>
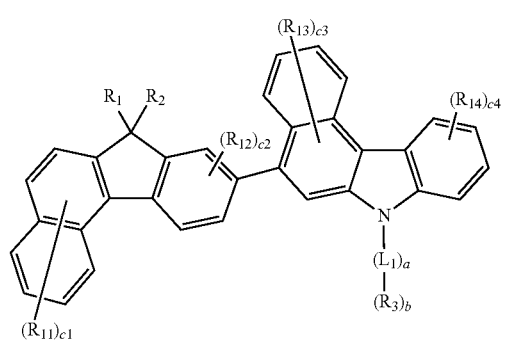
<Formula 1E(1)>
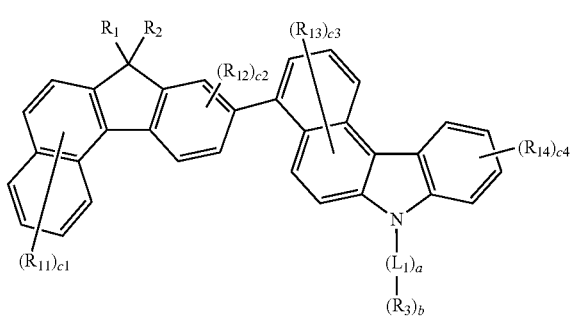

-continued

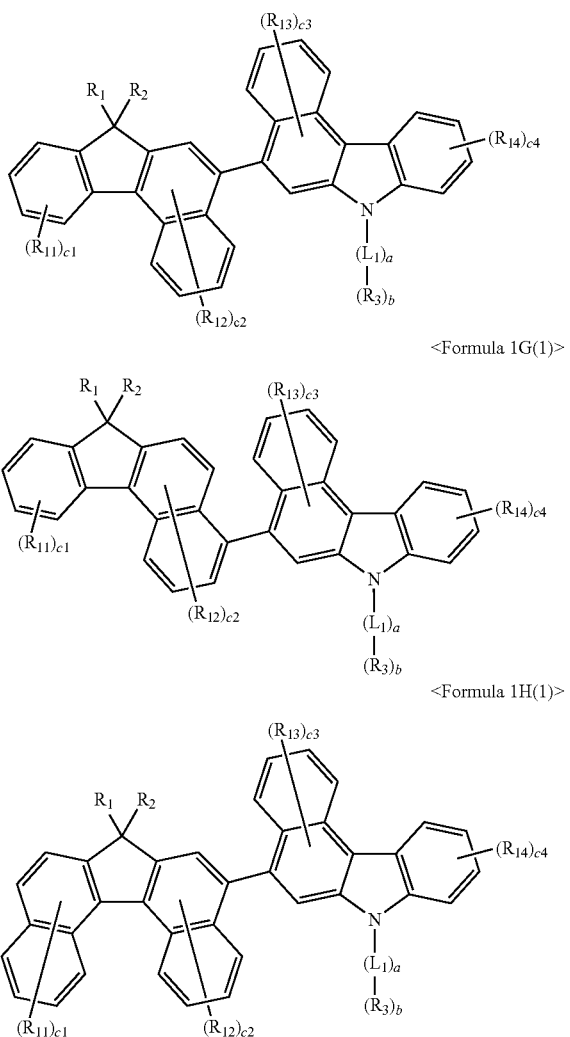

<Formula 1F(1)>

<Formula 1G(1)>

<Formula 1H(1)>

In Formulae 1A(1), 1A(2), 1A(3), 1B(1), 1C(1), 1D(1), 1E(1), 1F(1), 1G(1), and 1H(1), $L_1$, a, $R_1$ to $R_3$, b, $R_{11}$ to $R_{14}$, c1, c2, c3, c4, and

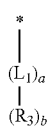

are as described above with respect to Formula 1.

For example, in Formulae 1A(1), 1A(2), 1A(3), 1B(1), 1C(1), 1D(1), 1E(1), 1F(1), 1G(1), and 1H(1), $R_1$ and $R_2$ may be each independently:

a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each or which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group.

Also, in Formulae 1A(1), 1A(2), 1A(3), 1B(1), 1C(1), 1D(1), 1E(1), 1F(1), 1G(1), and 1H(1), $R_{11}$ to $R_{14}$ may be each independently:

a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each of which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group.

Additionally, in Formulae 1A(1), 1A(2), 1A(3), 1B(1), 1C(1), 1D(1), 1E(1), 1F(1), 1G(1), and 1H(1), c1, c2, c3, and c4 may be each independently an integer from 1 to 3.

Also, in Formulae 1A(1), 1A(2), 1A(3), 1B(1), 1C(1), 1D(1), 1E(1), 1F(1), 1G(1), and 1H(1), the group represented by

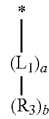

may be represented by one of Formulae 2-1 to 2-7 above.

Alternatively, in Formulae 1A(1), 1A(2), 1A(3), 1B(1), 1C(1), 1D(1), 1E(1), 1F(1), 1G(1), and 1H(1), $R_1$ and $R_2$ may be each independently:

a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group, each of which is substituted with a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; but $R_1$ and $R_2$ are not limited thereto.

Also, in some embodiments, in Formulae 1A(1), 1A(2), 1A(3), 1B(1), 1C(1), 1D(1), 1E(1), 1F(1), 1G(1), and 1H(1), $R_{11}$ to $R_{14}$ may each be a hydrogen atom, but $R_{11}$ to $R_{14}$ are not limited thereto.

Additionally, in some exemplary embodiments, in Formulae 1A(1), 1A(2), 1A(3), 1B(1), 1C(1), 1D(1), 1E(1), 1F(1), 1G(1), and 1H(1), the group represented by

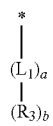

may be represented by one of Formulae 3-1 to 3-14 above, but

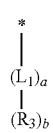

is not limited thereto.

The carbazole-based compound may be one of Compounds 1 to 27 below, but is not limited thereto:

1

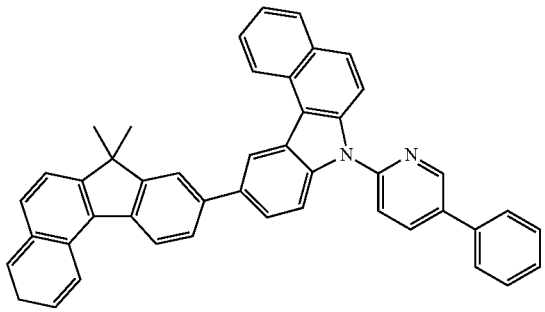

2

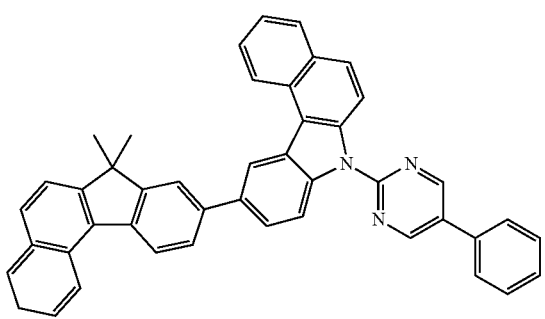

3

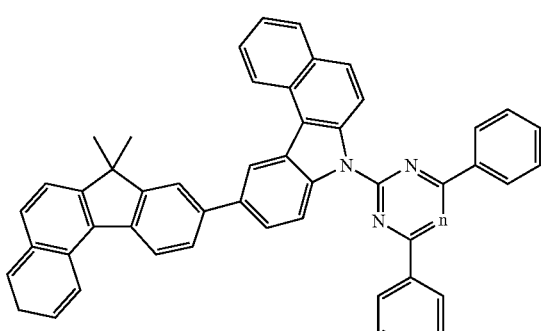

4

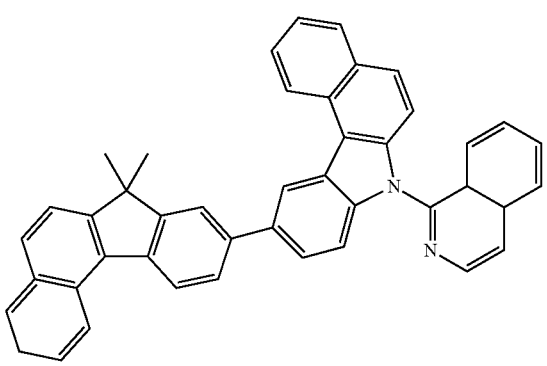

-continued
5
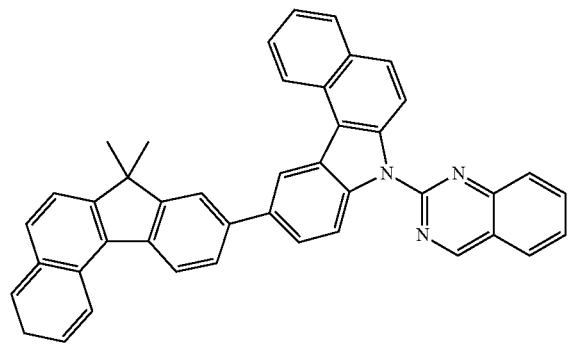
6
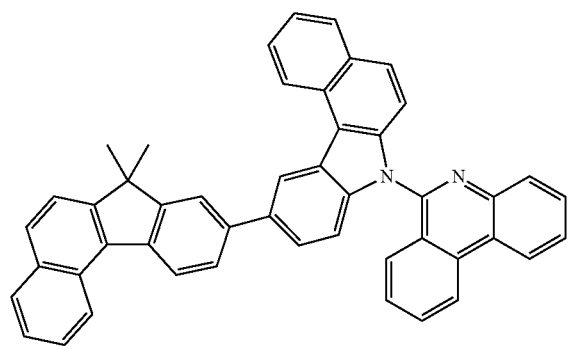
7
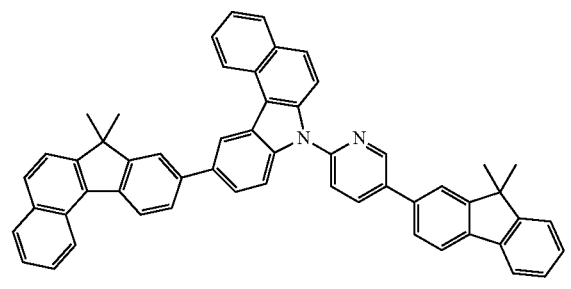
8
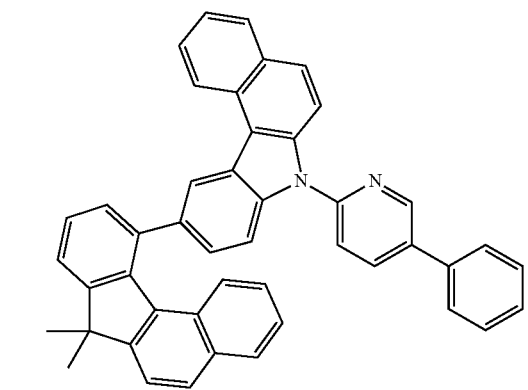
-continued
9
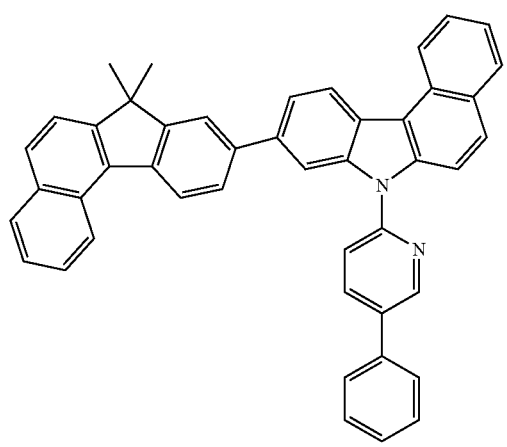
10
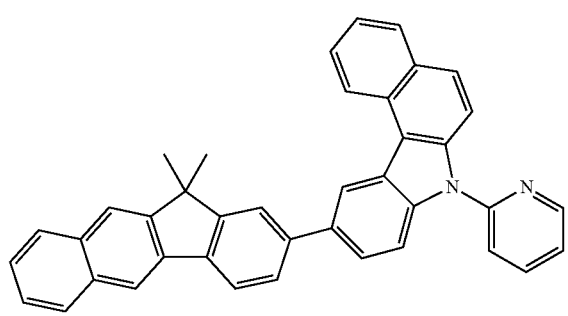
11
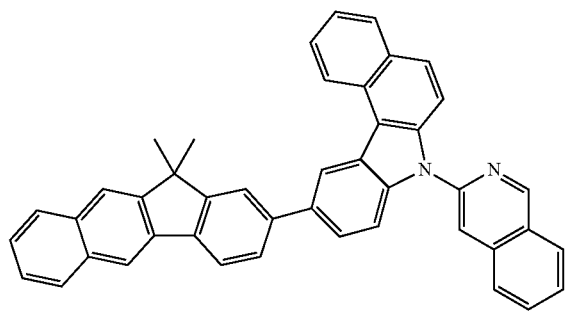
12
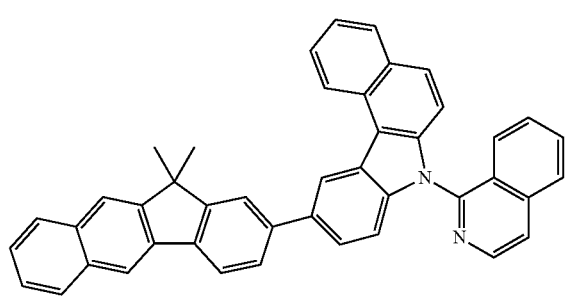

13
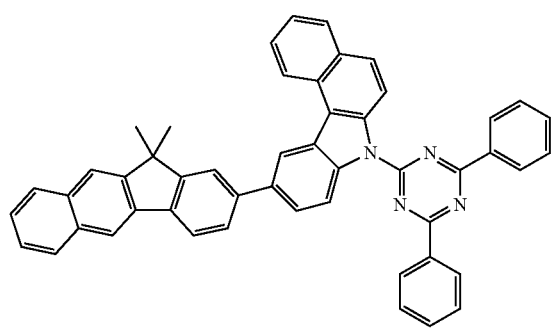
14
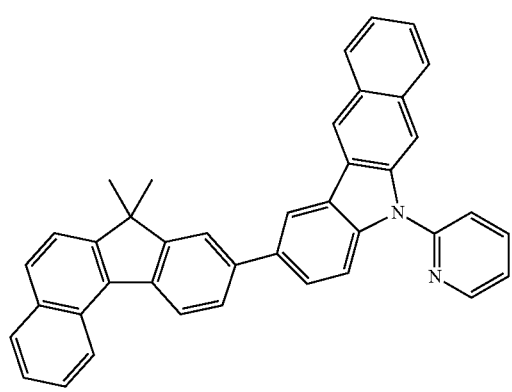
15
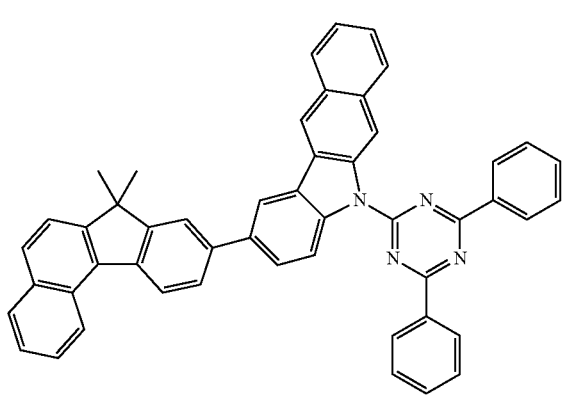
16
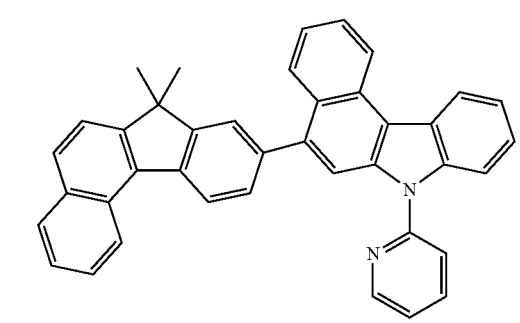
17
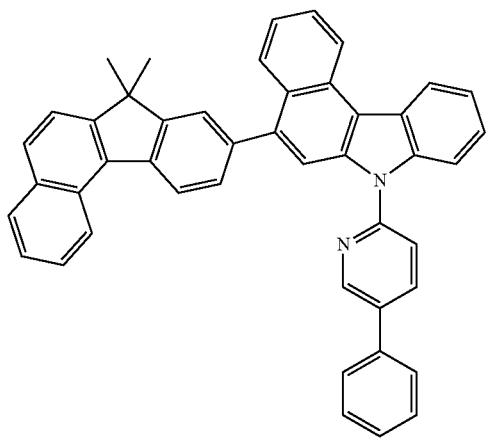
18
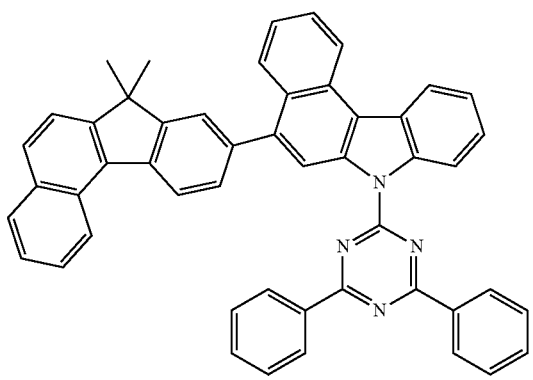
19
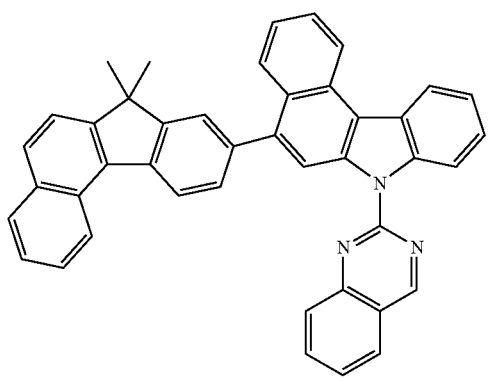
20
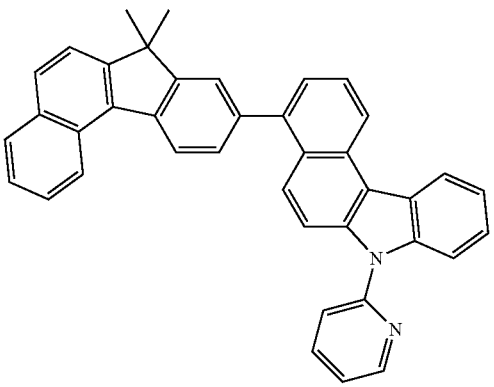

21

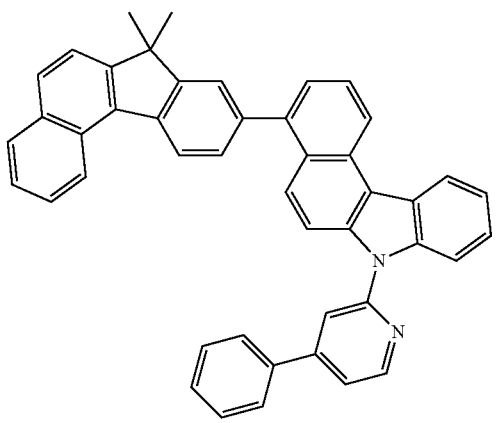

22

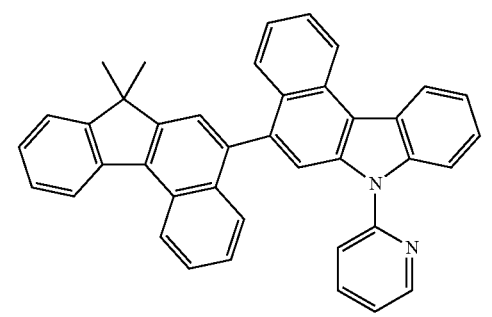

23

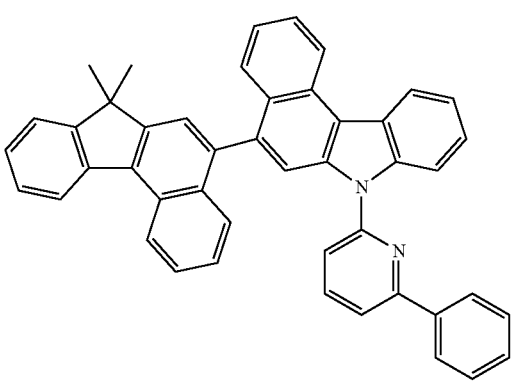

24

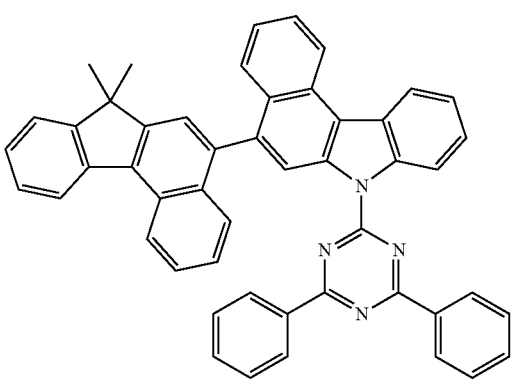

25

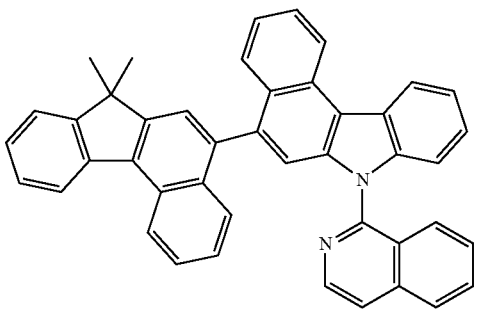

26

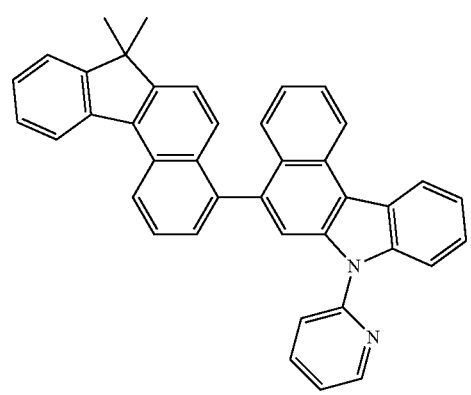

27

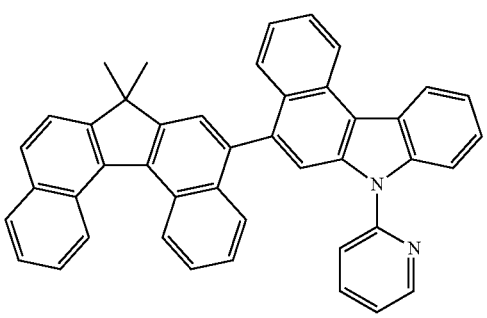

In Formula 1, at least one substituent of the substituted $C_3$-$C_{10}$ cycloalkylene group, the substituted $C_3$-$C_{10}$ heterocycloalkylene group, the substituted $C_2$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_3$-$C_{10}$ heterocycloalkyl group, the substituted $C_2$-$C_{10}$ cycloalkenyl group, the substituted $C_2$-$C_{10}$ heterocycloalkenyl group, the substituted $C_6$-$C_{60}$ aryl group, and the substituted $C_2$-$C_{60}$ heteroaryl group may be:

a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is substituted with a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group, each of which is substituted with a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or —N($Q_{11}$)($Q_{12}$) or —Si($Q_{11}$)($Q_{12}$)($Q_{13}$) where $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group.

In the carbazole-based compound represented by Formula 1, ring A, ring B, ring C, and ring D may be each independently a benzene ring, a naphthalene ring, an anthracene ring, a phenanthrene ring, a pyrene ring, a pyridine ring, a pyrimidine ring, or a pyrazine ring, except that ring A, ring B, ring C, and ring D are not all benzene rings. In this regard, in Formula 1, a B moiety (see Formula 1' below) having a carbazole-based core may provide good hole transporting capability and a large triplet energy, as well as a high glass transition temperature. Thus, the carbazole-based compound represented by Formula 1 may have good thermal stability as well as satisfactory electrical characteristics. In addition, in Formula 1, an A moiety (see Formula 1' below) having a fluorene-based core may provide high quantum efficiency. Therefore, an organic light-emitting diode including the carbazole-based compound represented by Formula 1 may have high efficiency.

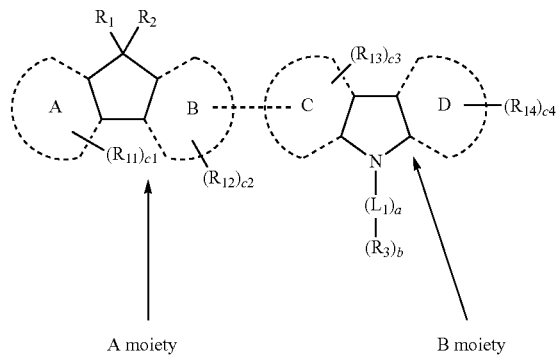

<Formula 1'>

A moiety    B moiety

The carbazole-based compound represented by Formula 1 may be synthesized using known organic synthesis methods. Those of ordinary skill in the art would be able to determine the method of synthesizing the carbazole-based compound by reference the examples which are described later.

The carbazole-based compound of Formula 1 may be disposed between a pair of electrodes of an organic light-emitting diode. For example, the carbazole-based compound may be used in at least one of a hole injection layer (HIL), a hole transport layer (HTL), and/or a functional layer having both hole injecting and hole transporting capabilities and/or an emission layer (EML).

Accordingly, an organic light-emitting diode according to an embodiment of the present invention includes a first electrode, a second electrode facing the first electrode, and an organic layer between the first electrode and the second electrode. The organic layer may include at least one carbazole-based compound represented by Formula 1.

The expression "(the organic layer) may include at least one carbazole-based compound," as used herein, may be interpreted as meaning "(the organic layer) may include one carbazole-based compound represented by Formula 1, or at least two different kinds of carbazole-based compounds represented by Formula 1."

For example, the organic layer may include only Compound 8 as the carbazole-based compound. Here, Compound 8 may be contained in the EML of the organic light-emitting diode. Alternatively, the organic layer may include Compound 8 and Compound 35 as the carbazole-based compound. Here, Compound 8 and Compound 35 may be contained in the same layer (e.g., Compound 8 and Compound 35 may be contained in the EML) or in different layers (e.g., Compound 8 may be contained in the EML while Compound 35 may be contained in the HTL).

The organic layer may include at least one layer selected from a HIL, a HTL, a functional layer having both hole injecting and hole transporting capabilities (hereinafter, referred to as an "H-functional layer), a buffer layer, an electron blocking layer (EBL), an EML, a hole blocking layer (HBL), an ETL, an electron injection layer (EIL), and a functional layer having both electron injecting and electron transporting capabilities (hereinafter, referred to as an "E-functional layer").

The term "organic layer," as used herein, refers to a single layer and/or a plurality of layers disposed between the first electrode and the second electrode of the organic light-emitting diode.

The organic layer may include at least one of the HIL, the HTL, and the H-functional layer, and the at least one of the HIL, the HTL, and the H-functional layer may include the carbazole-based compound.

FIG. 1 is a schematic sectional view of an organic light-emitting diode 10 according to an embodiment of the present invention. Hereinafter, the organic light-emitting diode 10 and a method of fabricating the organic light-emitting diode 10 will be described with reference to FIG. 1.

The substrate 11 may be any substrate that is commonly used in organic light emitting devices, and may be a glass substrate or a transparent plastic substrate with good mechanical strength, thermal stability, transparency, surface smoothness, ease of handling, and waterproofness.

The first electrode 13 may be formed on the substrate 11 by depositing or sputtering a material that is used to form the first electrode 13. When the first electrode 13 is an anode, the material used to form the first electrode 13 may be a high work-function material so as to facilitate hole injection. The first electrode 13 may be a reflective electrode or a transmissive electrode. Transparent and conductive materials, such as indium tin oxide (ITO), indium zinc oxide (IZO), tin oxide ($SnO_2$), and zinc oxide (ZnO), may be used to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layered or a multi-layered structure. For example, the first electrode 13 may have a triple-layer structure of ITO/Ag/ITO, but is not limited thereto.

The organic layer 15 may be disposed on the first electrode 13.

The organic layer 15 may include a HIL, a HTL, a buffer layer, an EML, an ETL, and an EIL.

The HIL may be formed on the first electrode 13 by vacuum deposition, spin coating, casting, Langmuir-Blodgett (LB) deposition, or the like. When the HIL is formed using vacuum deposition, the deposition conditions may vary according to the compound that is used to form the HIL, and the desired structural and thermal characteristics of the HIL to be formed. For example, the deposition conditions may include a deposition temperature of 100 to 500° C., a vacuum pressure of $10^{-8}$ to $10^{-3}$ torr, and a deposition rate of 0.01 to 100 Å/sec, but the deposition conditions are not limited thereto.

When the HIL is formed using spin coating, the coating conditions may vary according to the compound that is used to form the HIL, and the structural and thermal properties of the HIL to be formed. For example, the coating conditions may include a coating speed of about 2000 rpm to about 5000 rpm, and a thermal treatment temperature of about 80° C. to about 200° C. The thermal treatment removes the solvent after coating. However, the coating conditions are not limited thereto.

The HIL may be formed of any material that is commonly used to form an HIL. Examples of hole injecting materials include, but are not limited to, N,N'-diphenyl-N,N'-bis-[4-(phenyl-m-tolyl-amino)-phenyl]-biphenyl-4,4'-diamine (DNTPD), a phthalocyanine compound such as copper-phthalocyanine, 4,4',4"-tris (3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS).

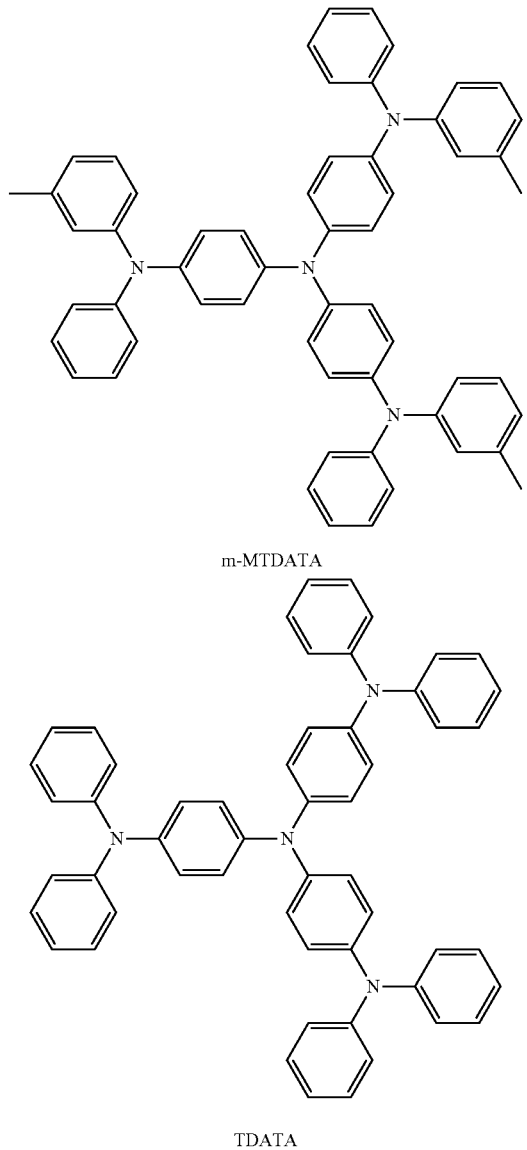

m-MTDATA

TDATA

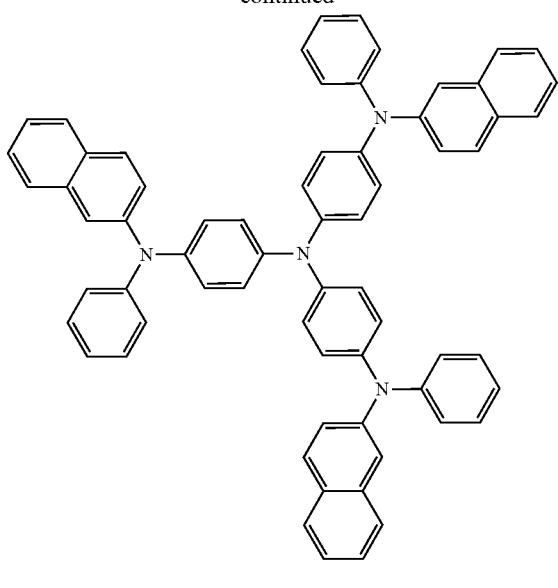

2-TNATA

Also, the HIL may include the carbazole-based compound represented by Formula 1, but is not limited thereto.

The thickness of the HIL may be about 100 to about 10,000 Å, and for example, about 100 to about 1,000 Å. When the thickness of the HIL is within these ranges, the HIL may have good hole injecting ability without a substantial increase in driving voltage.

Then, the HTL may be formed on the HIL by vacuum deposition, spin coating, casting, LB deposition, or the like. When the HTL is formed by vacuum deposition or spin coating, the conditions for deposition or coating may be similar to those described above for the formation of the HIL, although the conditions for deposition or coating may vary according to the material that is used to form the HTL.

Examples of hole transporting materials include a carbazole derivative such as N-phenylcarbazole and polyvinyl carbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB), but are not limited thereto.

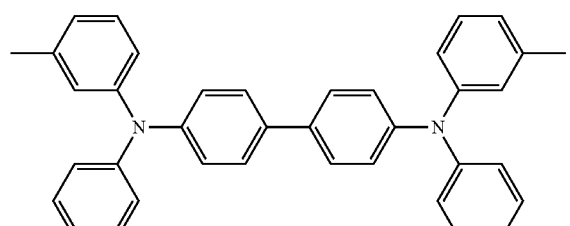

TPD

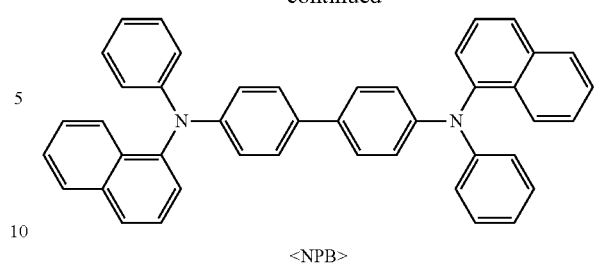

<NPB>

Also, the HTL may include the carbazole-based compound represented by Formula 1, but is not limited thereto.

The thickness of the HTL may be in a range of about 50 to about 2000 Å, for example, about 100 to about 1500 Å. When the thickness of the HTL is within these ranges, the HTL may have good hole transporting ability without a substantial increase in driving voltage.

The H-functional layer (i.e., a functional layer having both hole injecting and hole transporting capabilities) may include one or more materials selected from hole injecting materials and hole transporting materials, and the thickness of the H-functional layer may be in a range of about 100 to about 10000 Å, for example about 100 to about 1000 Å. When the thickness of the H-functional layer is within these ranges, the H-functional layer may have good hole injecting and transporting ability without a substantial increase in driving voltage.

Also, the H-functional layer may include the carbazole-based compound represented by Formula 1, but is not limited thereto.

In order to improve conductivity, at least one of the HIL, the HTL, and the H-functional layer may further include a charge-generating material in addition to the hole injecting materials, hole transporting materials, and/or materials having both hole injecting and hole transporting capabilities. The charge-generating material may be a p-dopant. The p-dopant may be a quinone derivative, a metal oxide, or a cyano group-containing compound, but is not limited thereto. Nonlimiting examples of the p-dopant include a quinine derivative such as tetracyanoquinonedimethane (TCNQ) and 2,3,5,6-tetrafluorotetracyano-1,4-benzoquinonedimethane (F4TCNQ); a metal oxide such as tungsten oxide and molybdenum oxide; and a cyano group-containing compound such as Compound 200 below.

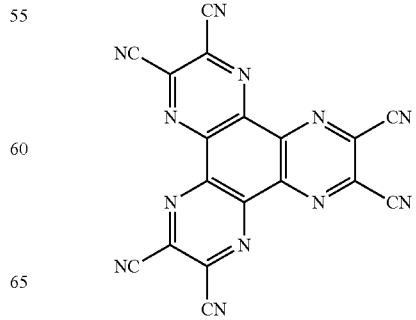

<Compound 200>

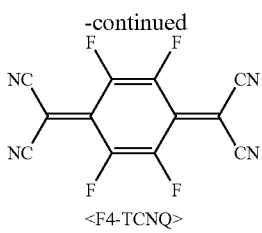

<F4-TCNQ>

If the HIL, the HTL, or the H-functional layer further includes the charge-generating material, the charge-generating material may be homogeneously or non-homogeneously dispersed in the HIL, the HTL, or the H-functional layer. Also, a variety of modifications may be possible.

A buffer layer may be disposed between the EML and at least one of the HIL, the HTL, and the H-functional layer. The buffer layer may increase efficiency by compensating for an optical resonance length according to a wavelength of light emitted from the EML. The buffer layer may include hole injecting materials and hole transporting materials. The buffer layer may also include a material that is the same as one of the materials contained in the HIL, the HTL, and the H-functional layer disposed under the buffer layer.

Then, the EML may be formed on the HTL, H-functional layer, or buffer layer by vacuum deposition, spin coating, casting, LB deposition, or the like. When the EML is formed by using vacuum deposition or spin coating, the deposition or coating conditions may be similar to those described above to form the HIL, although the deposition and coating conditions may vary according to the compound that is used to form the EML.

The EML may include a host and a dopant. The dopant may be a fluorescent dopant and/or a phosphorescent dopant. The phosphorescent dopant may be an organic metal compound including Ir, Pt, Os, Ti, Zr, Hf, Eu, Tb, or Tm.

In the EML, the host may be the carbazole-based compound represented by Formula 1.

When the organic light-emitting diode is a full-color organic light-emitting diode, the EML may be patterned as a red EML, a green EML, and a blue EML. Also, the EML may emit white light by having a structure of two or more of a red EML, a green EML, and a blue EML stacked over each other, but the EML is not limited thereto.

At least one of the red EML, green EML, and blue EML may include the dopants described below (ppy=phenylpyridine).

Examples of blue dopants include the compounds below, but are not limited thereto.

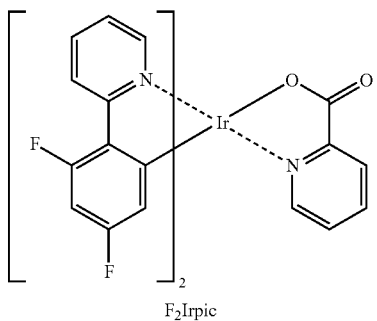

F$_2$Irpic

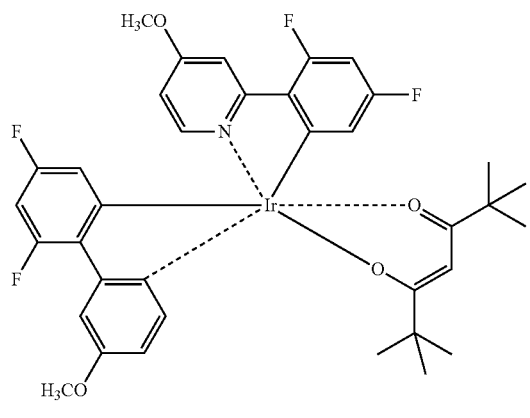

(F$_{2ppy}$)$_2$Ir(tmd)

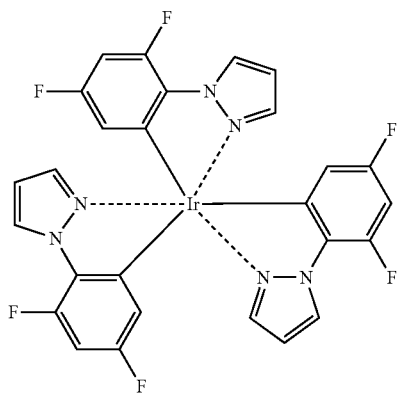

Ir(dfppaz)$_3$

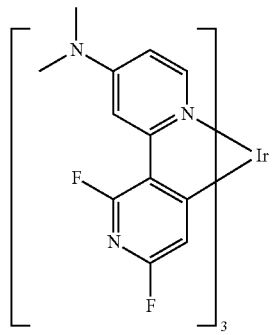

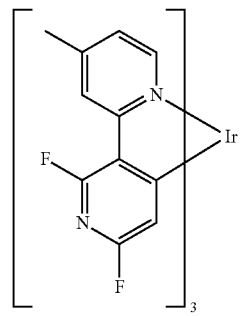

-continued
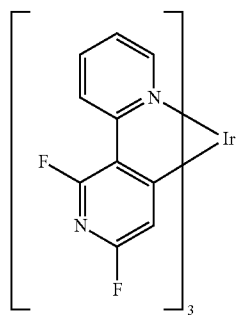 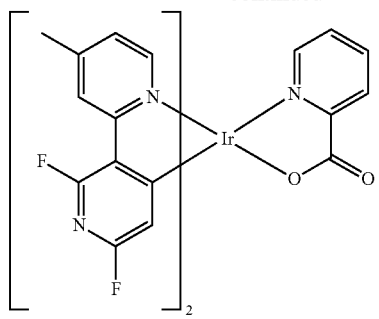 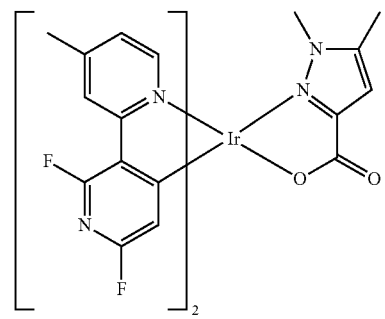
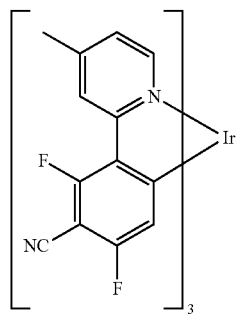 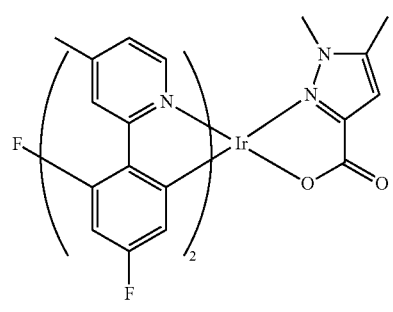 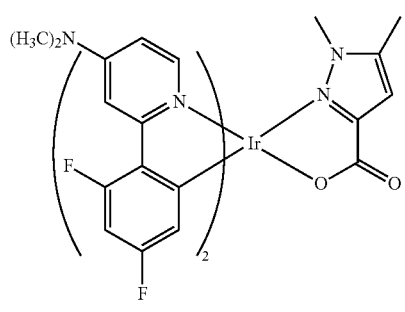
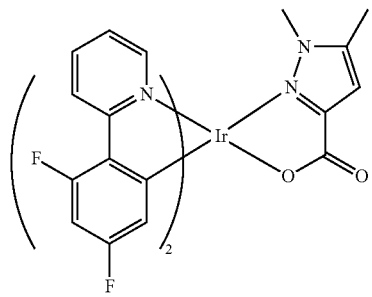 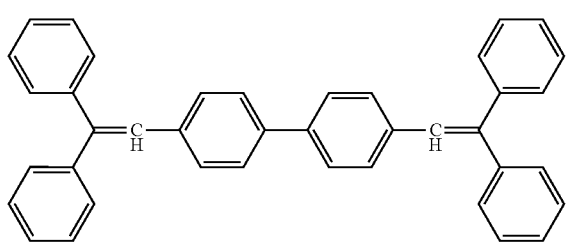
DPVBi
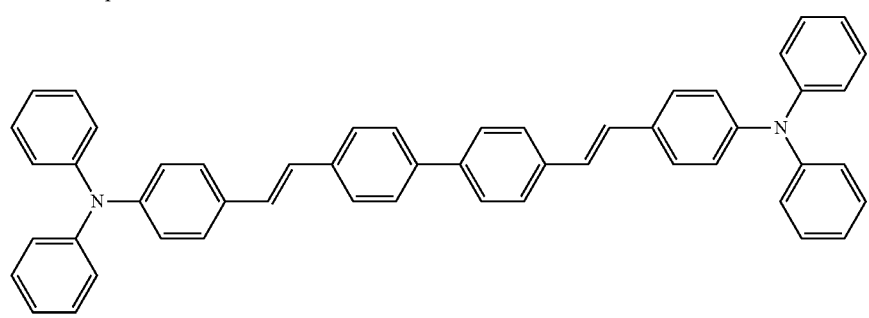
DPAVBi
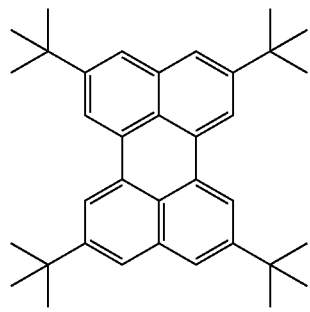
TBPe Examples of red dopants include the compounds below, but are not limited thereto. Also, DCM or DCJTB below may be used as the red dopant.
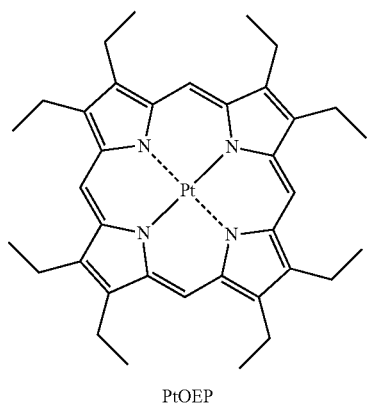
PtOEP
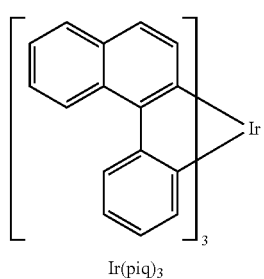
Ir(piq)₃
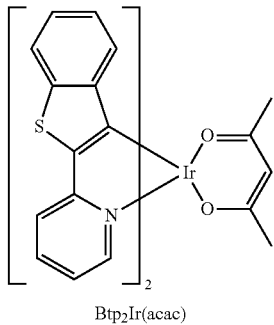
Btp₂Ir(acac)
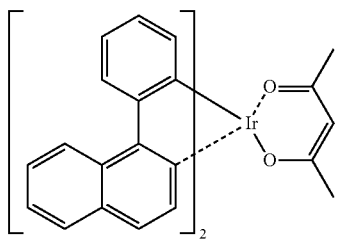
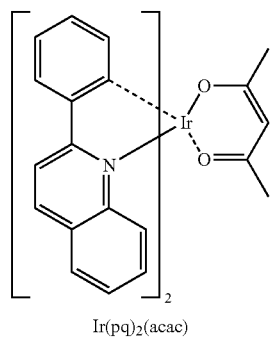
Ir(pq)₂(acac)
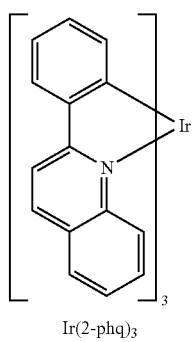
Ir(2-phq)₃
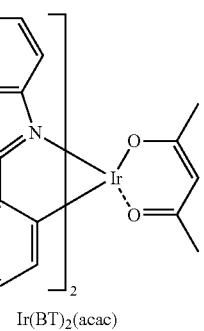
Ir(BT)₂(acac)
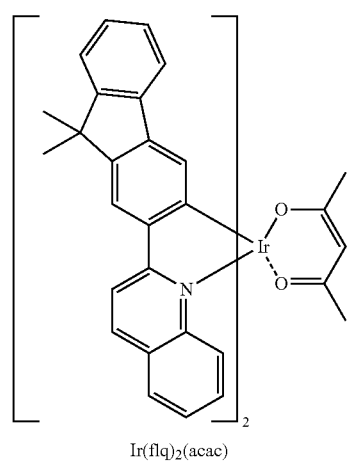
Ir(flq)₂(acac)
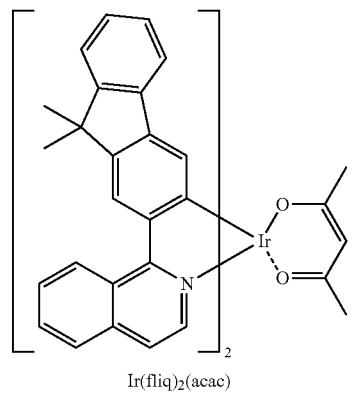
Ir(fliq)₂(acac)
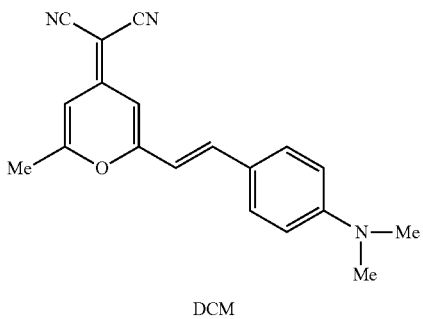
DCM

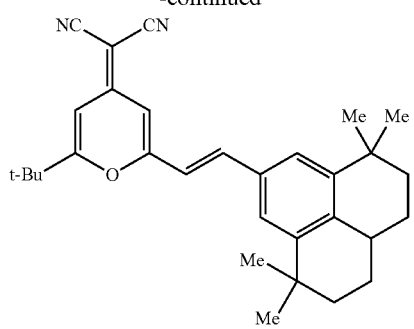
DCJTB
Examples of green dopants include the compounds below, but are not limited thereto. Also, C545T below may be used as the green dopant.
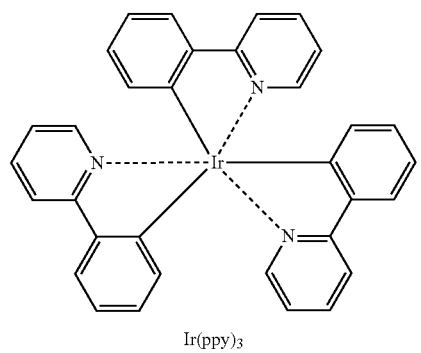
Ir(ppy)₃
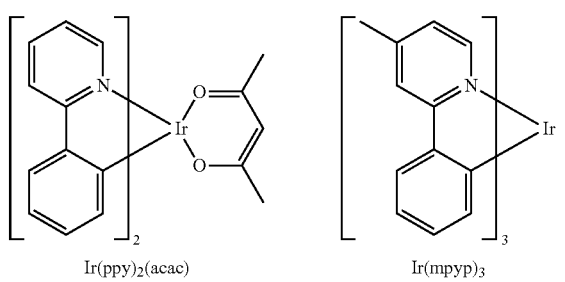
Ir(ppy)₂(acac)            Ir(mpyp)₃
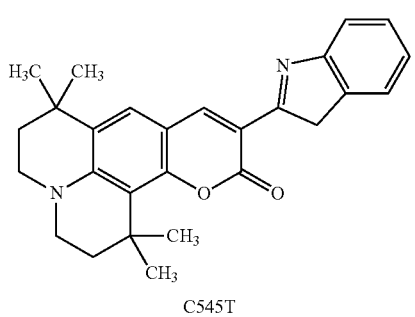
C545T
The dopant that may be included in the EML may be a complex, and examples of the complex include the compounds below, but are not limited thereto.
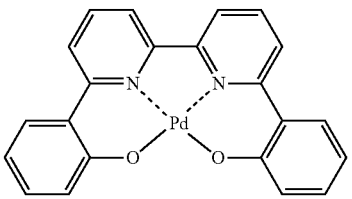
D1
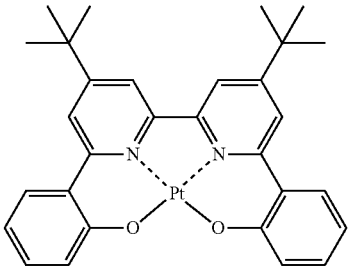
D2
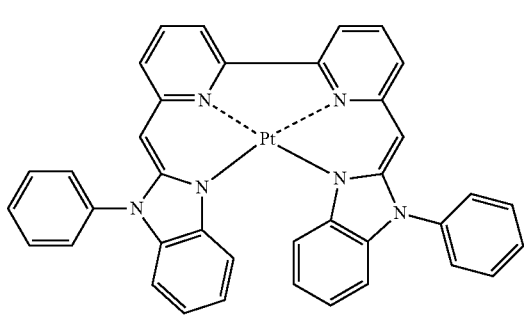
D3
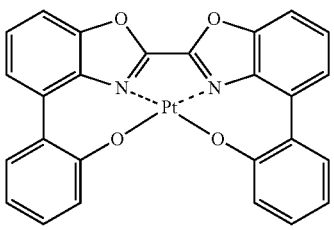
D4
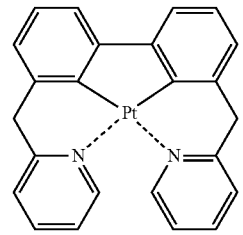
D5
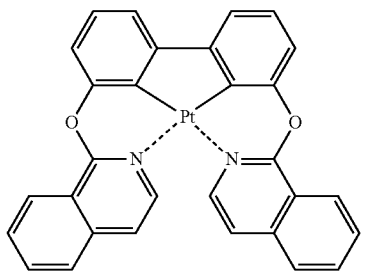
D6

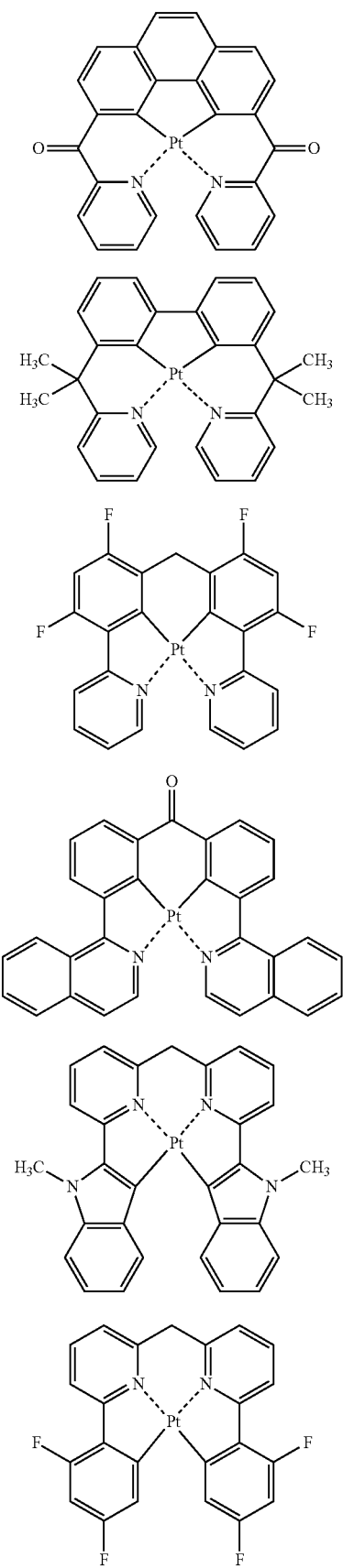
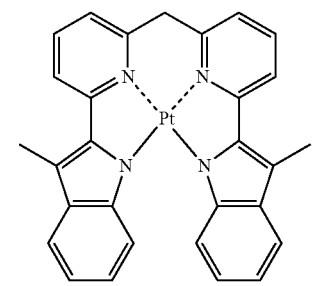
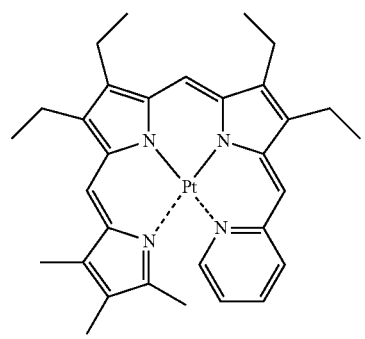
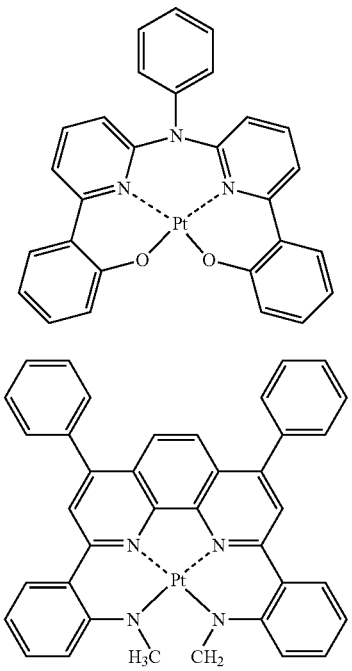

D18 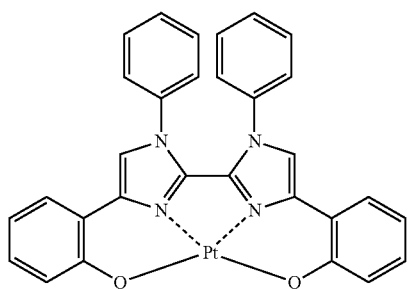
D19 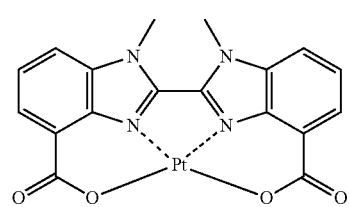
D20 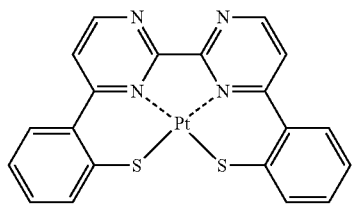
D21 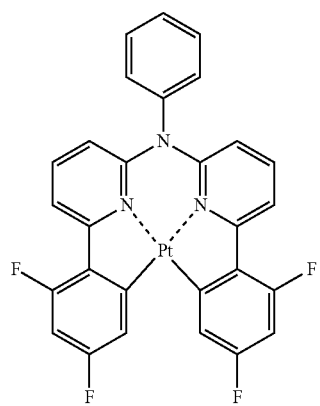
D22 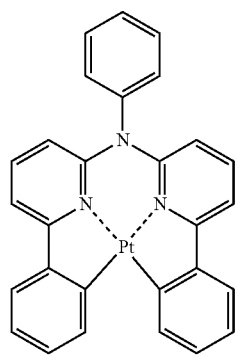
D23 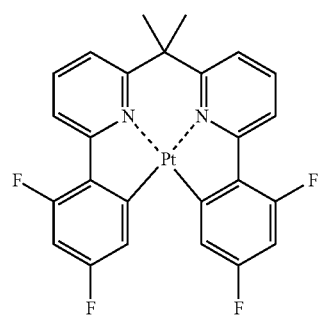
D24 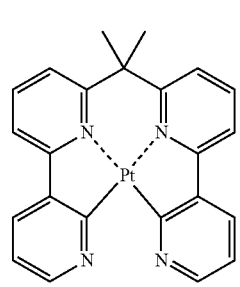
D25 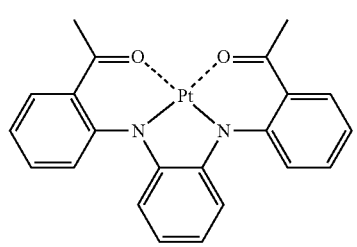
D26 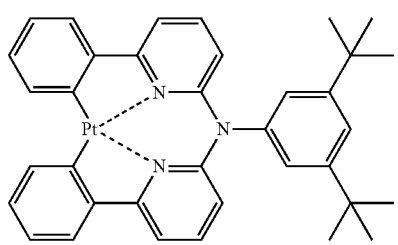
D27 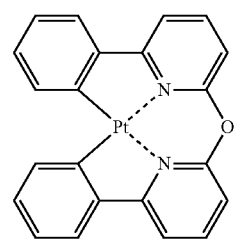
D28 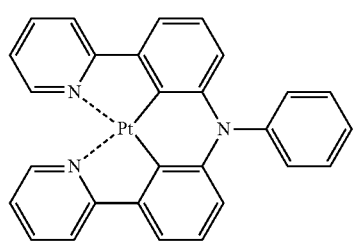

D29 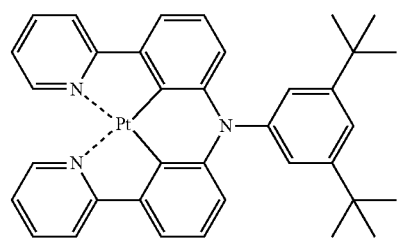
D30 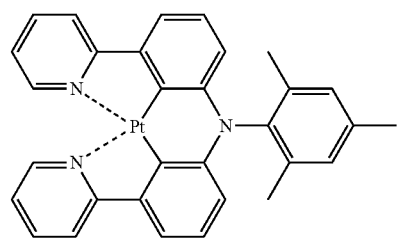
D31 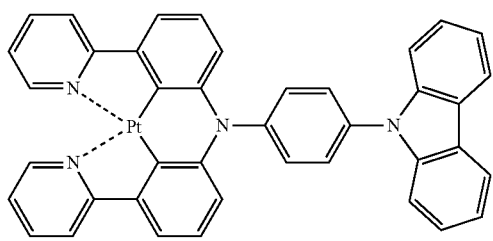
D32 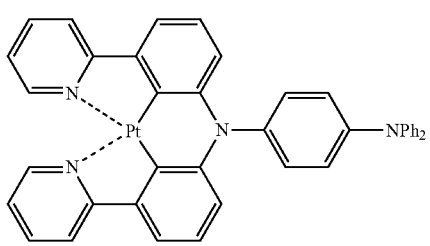
D33 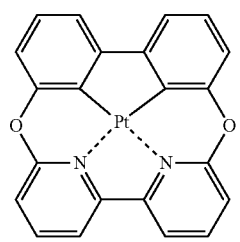
D34 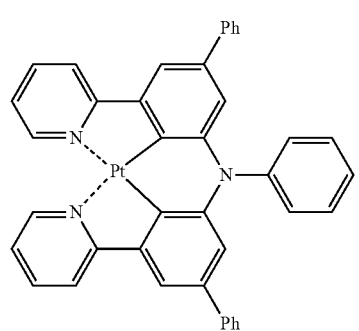
D35 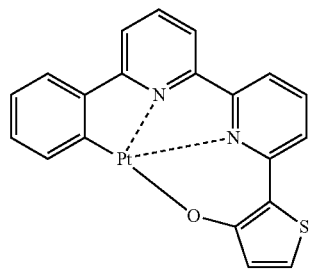
D36 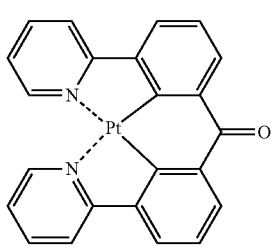
D37 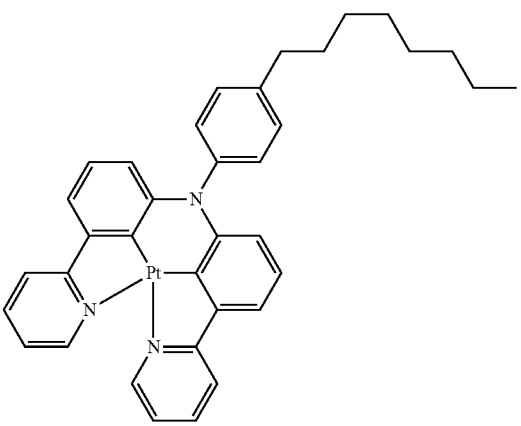
D38 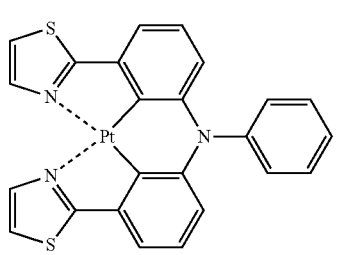
D39 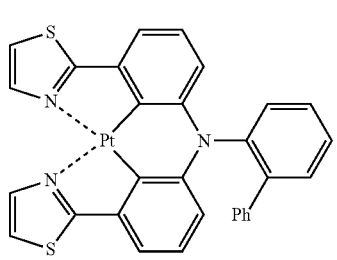

-continued
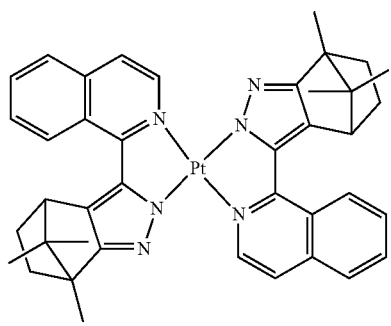
D40
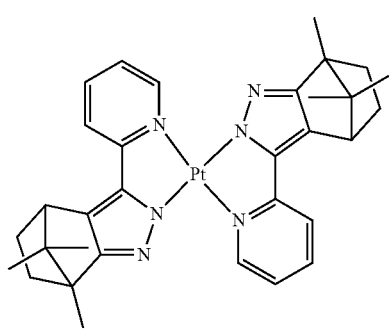
D41
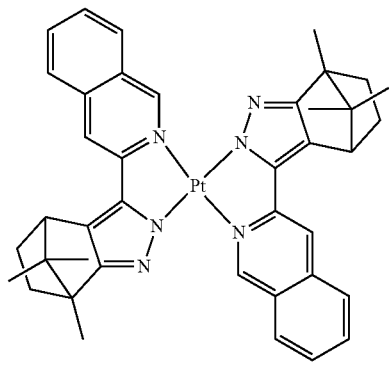
D42
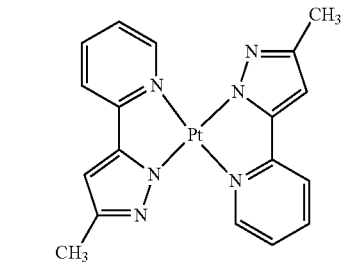
D43
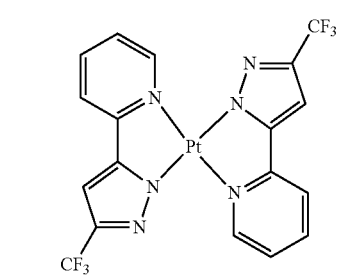
D44
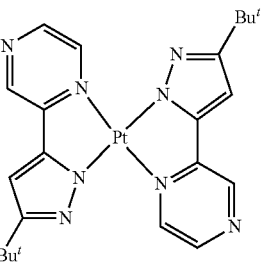
D45
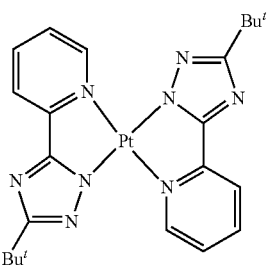
D46
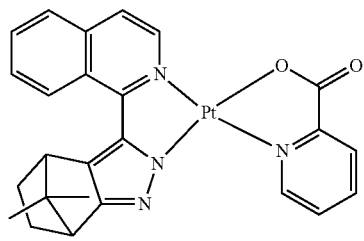
D47
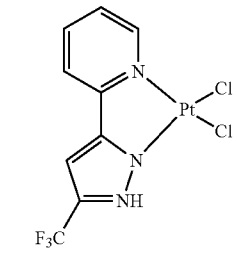
D48
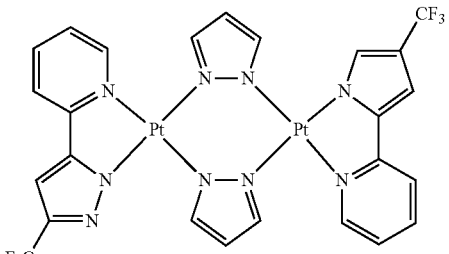
D49
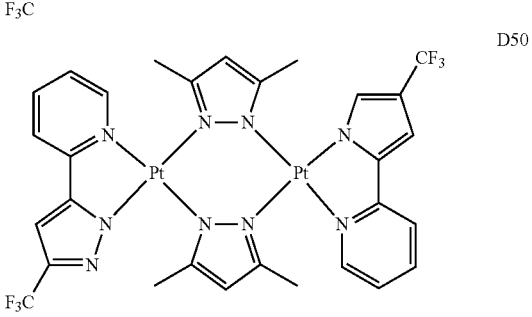
D50

Also, the dopant that may be included in the EML may be an Os-complex, and examples of the Os-complex include the compounds below, but are not limited thereto.

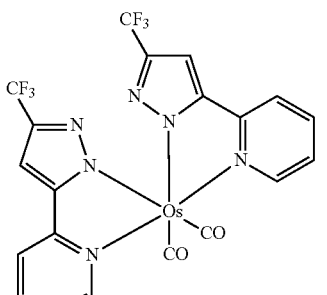

Os(fppz)$_2$(CO)$_2$

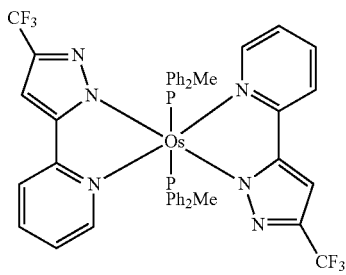

Os(fppz)$_2$(PPh$_2$Me)$_2$

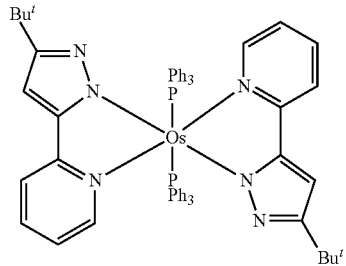

Os(bppz)$_2$(PPh$_3$)$_2$

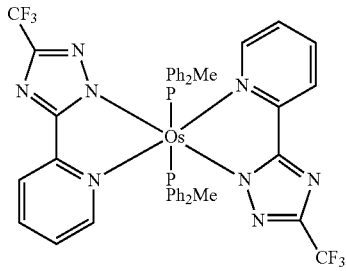

Os(fptz)$_2$(PPh$_2$Me)$_2$

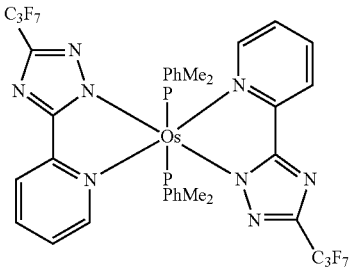

Os(hptz)$_2$(PPhMe$_2$)$_2$

When the EML includes a host and a dopant, the amount of the dopant may be in the range of about 0.01 to about 15 parts by weight based on about 100 parts by weight of the host, but is not limited thereto.

The thickness of the EML may be in the range of about 100 Å to about 1000 Å, for example, about 200 Å to about 600 Å. When the thickness of the EML is within these ranges, the EML may have good light emitting ability without a substantial increase in driving voltage.

Then, the ETL may be formed on the EML by vacuum deposition, spin coating, casting, or the like. When the ETL is formed using vacuum deposition or spin coating, the deposition or coating conditions may be similar to those described above for formation of the HIL, although the deposition or coating conditions may vary according to the compound that is used to form the ETL.

Electron transporting materials, including materials that can stably transport electrons injected from the electron injecting electrode (cathode), may be used as the material of the ETL. Nonlimiting examples of electron transporting materials include quinoline derivatives, such as tris(8-quinolinolate)aluminum (Alq3), TAZ, Balq1, beryllium bis(benzoquinolin-10-olate) (Balq$_2$), ADN, Compound 201, and Compound 202.

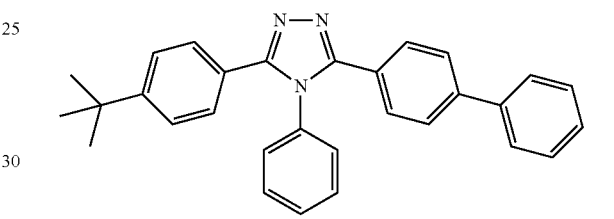

TAZ

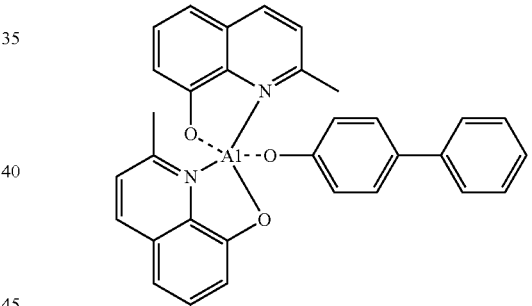

BAlq

<Compound 201>

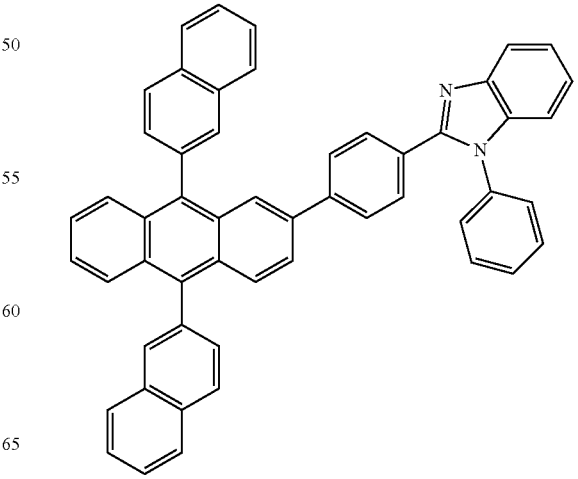

<Compound 202>

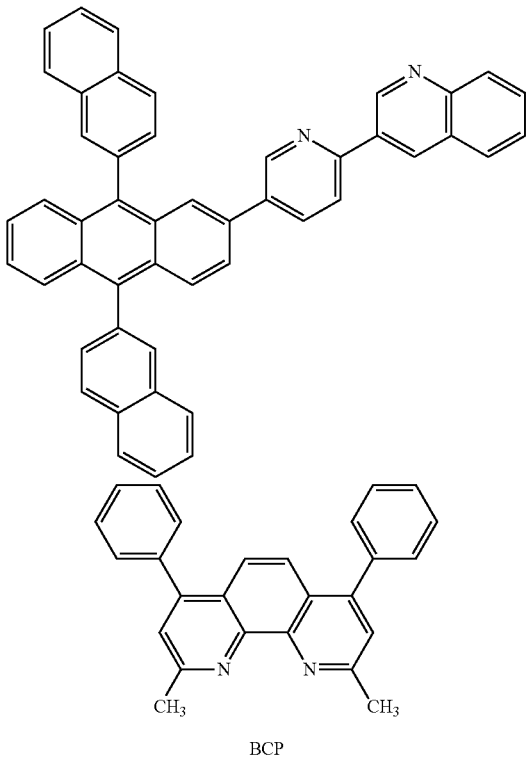

BCP

The thickness of the ETL may be in the range of about 100 Å to about 1,000 Å, for example, about 150 Å to about 500 Å. When the thickness of the ETL is within the ranges described above, the ETL may have good electron transporting ability without a substantial increase in driving voltage.

The ETL may further include a metal-containing material in addition to the electron transporting organic compound(s).

The metal-containing material may include a Li-complex. Nonlimiting examples of the Li-complex include lithium quinolate (LiQ) or Compound 203 below.

<Compound 203>

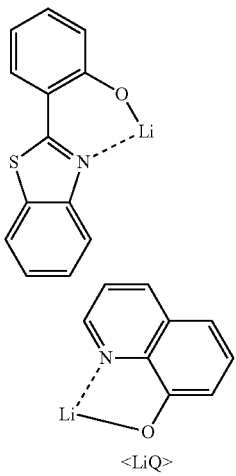

<LiQ>

In addition, the EIL may be formed on the ETL using any material that allows electrons to be easily injected from the cathode. Examples of electron injecting materials include LiF, NaCl, CsF, Li$_2$O, and BaO. The conditions for deposition of the EIL are similar to those described above for formation of the HIL, although the deposition conditions may vary according to the material that is used to form the EIL.

The thickness of the EIL may be in the range of about 1 Å to about 100 Å, for example, in the range of about 3 Å to about 90 Å. When the thickness of the EIL is within these ranges, the EIL may have good electron injecting ability without a substantial increase in driving voltage.

The second electrode 17 is disposed on the organic layer 15. The second electrode 17 may be a cathode, which is an electron injecting electrode. A metal for forming the second electrode 17 may be a metal, an alloy, an electrically conductive compound, all of which have low-work functions, or a mixture thereof. In this regard, the second electrode 17 may be a transmissive electrode formed of lithium (Li), magnesium (Mg), aluminum (Al), aluminum (Al)-lithium (Li), calcium (Ca), magnesium (Mg)-indium (In), magnesium (Mg)-silver (Ag), or the like. In order to manufacture a top-emission type organic light-emitting diode, a transmissive electrode formed of ITO or IZO may be used.

The organic light-emitting diode is described with reference to FIG. 1, but is not limited thereto.

When a phosphorescent dopant is used in the EML, a HBL may be formed between the HTL and the EML or between the H-functional layer and the EML in order to prevent diffusion of triplet excitons or holes into the ETL. The HBL may be formed by vacuum deposition, spin coating, casting, LB deposition, or the like. When the HBL is formed using vacuum deposition or spin coating, the conditions for deposition or coating may be similar to those described above for the formation of the HIL, although the conditions for deposition and coating may vary according to the material that is used to form the HBL. Any material that is commonly used to form a HBL may be used. Examples of electron blocking materials include an oxadiazole derivative, a triazole derivative, and a phenanthroline derivative. For example, BCP may be used as the hole blocking material.

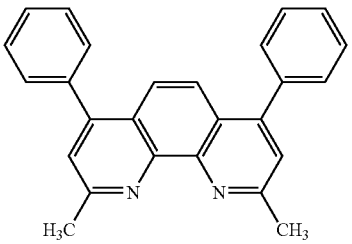

BCP

The thickness of the HBL may be in a range of about 20 Å to about 1,000 Å, for example, about 30 Å to about 300 Å. When the thickness of the HBL is within these ranges, the HBL may have good hole blocking ability without a substantial increase in driving voltage.

Hereinafter, one or more embodiments will be described with reference to the following examples. These examples are presented for illustrative purposes only and are not intended to limit the purpose and scope of the one or more embodiments of the present invention.

The unsubstituted $C_1$-$C_{60}$ alkyl group (or the $C_1$-$C_{60}$ alkyl group), as used herein, refers to a linear or branched alkyl group that contains 1 to 60 carbon atoms. Examples of the $C_1$-$C_{60}$ alkyl group may include methyl, ethyl, propyl, isobutyl, sec-butyl, pentyl, iso-amyl, hexyl, heptyl, octyl, nonyl, and dodecyl. The substituted $C_1$-$C_{60}$ alkyl group refers to the substitution of at least one hydrogen atom of the alkyl group with:

a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group, each of which is substituted with a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or —$N(Q_{11})(Q_{12})$ or —$Si(Q_{11})(Q_{12})(Q_{13})$ where $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group). However, the substituents of the substituted $C_1$-$C_{60}$ alkyl group are not limited thereto.

The unsubstituted $C_1$-$C_{60}$ alkoxy group (or the $C_1$-$C_{60}$ alkoxy group), as used herein, refers to a group having a structure of —OA where A is a $C_1$-$C_{60}$ alkyl group as described above. Examples of the $C_1$-$C_{60}$ alkoxy group may include methoxy, ethoxy, and isopropyloxy. The substituted $C_1$-$C_{60}$ alkoxy group refers to the substitution of at least one hydrogen atom of the alkoxy group with the substituent groups described above with reference to the substituted $C_1$-$C_{60}$ alkyl group.

The unsubstituted $C_2$-$C_{60}$ alkenyl group (or the $C_2$-$C_{60}$ alkenyl group), as used herein, refers to a hydrocarbon chain having at least one carbon-carbon double bond at a center or at a terminal end of an unsubstituted $C_2$-$C_{60}$ alkyl group. Examples of the $C_2$-$C_{60}$ alkenyl group may include ethenyl, propenyl, and butenyl. The substituted $C_2$-$C_{60}$ alkenyl group refers to the substitution of at least one hydrogen atom of the $C_2$-$C_{60}$ alkenyl group with the substituent groups described above with reference to the substituted $C_1$-$C_{60}$ alkyl group.

The unsubstituted $C_2$-$C_{60}$ alkynyl group (or the $C_2$-$C_{60}$ alkynyl group), as used herein, refers to a hydrocarbon chain having at least one carbon-carbon triple bond at a center or at a terminal end of an $C_2$-$C_{60}$ alkyl group. Examples of the $C_2$-$C_{60}$ alkynyl group may include ethynyl and propynyl. The substituted $C_2$-$C_{60}$ alkynyl group refers to the substitution of at least one hydrogen atom of the alkynyl group with the substituent groups described above with reference to the substituted $C_1$-$C_{60}$ alkyl group.

The unsubstituted $C_6$-$C_{60}$ aryl group, as used herein, refers to a monovalent group having a carbocyclic aromatic system of 6 to 60 carbon atoms and containing at least one aromatic ring. The unsubstituted $C_6$-$C_{60}$ arylene group, as used herein, refers to a divalent group having a carbocyclic aromatic system of 6 to 60 carbon atoms and containing at least one aromatic ring. When the aryl group or the arylene group includes two or more rings, the two or more rings may be fused to each other. The substituted $C_6$-$C_{60}$ aryl group refers to the substitution of at least one hydrogen atom in the aryl group with the substituent groups described above with reference to the substituted $C_1$-$C_{60}$ alkyl group. The substituted $C_6$-$C_{60}$ arylene group refers to the substitution of at least one hydrogen atom in the arylene group with the substituent groups described above with reference to the substituted $C_1$-$C_{60}$ alkyl group.

Examples of the substituted or unsubstituted $C_6$-$C_{60}$ aryl group may include a phenyl group, a $C_1$-$C_{10}$ alkylphenyl group (for example, an ethylphenyl group), a $C_1$-$C_{10}$ alkyl biphenyl group (for example, an ethylbiphenyl group), a halophenyl group (for example, o-, m-, and p-fluorophenyl groups, dichlorophenyl groups), a dicyanophenyl group, a trifluoromethoxyphenyl group, o-, m-, and p-tolyl groups, o-, m-, and p-cumenyl groups, a mesityl group, a phenoxyphenyl group, a ($\alpha,\alpha$-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group. Examples of the substituted $C_6$-$C_{60}$ aryl group may be easily recognized with reference to the examples of the unsubstituted $C_6$-$C_{60}$ aryl group and the substituent groups of the substituted $C_1$-$C_{60}$ alkyl group. Examples of the substituted or unsubstituted $C_6$-$C_{60}$ arylene group may be easily recognized with reference to the examples of the substituted or unsubstituted $C_6$-$C_{60}$ aryl group.

The unsubstituted $C_2$-$C_{60}$ heteroaryl group, as used herein, refers to a monovalent group having a system of at least one aromatic ring in which at least one ring atom is a heteroatom selected from N, O, P, and S, and the remaining ring atoms are carbon atoms. The unsubstituted $C_2$-$C_{60}$ heteroarylene group, as used herein, refers to a divalent group having a system of at least one aromatic ring in which at least one ring atom is a heteroatom selected from N, O, P, and S, and the remaining ring atoms are carbon atoms. Here, when the heteroaryl group or the heteroarylene group includes two or more rings, the two or more rings may be fused to each other. The substituted $C_2$-$C_{60}$ heteroaryl group refers to the substitution of at least one hydrogen atom in the heteroaryl group with the substituent groups described above with reference to the substituted $C_1$-$C_{60}$ alkyl group. The substituted $C_2$-$C_{60}$ heteroarylene group refers to the substitution of at least one hydrogen atom in the heteroarylene group with the substituent groups described above with reference to the substituted $C_1$-$C_{60}$ alkyl group.

Examples of the unsubstituted $C_2$-$C_{60}$ heteroaryl group may include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{60}$ heteroarylene group may be easily recognized with reference to the examples of the substituted or unsubstituted $C_2$-$C_{60}$ heteroarylene group.

The substituted or unsubstituted $C_6$-$C_{60}$ aryloxy group, as used herein, refers to a group represented by —$OA_2$ where $A_2$ is the substituted or unsubstituted $C_6$-$C_{60}$ aryl group. The substituted or unsubstituted $C_5$-$C_{60}$ arylthio group, as used herein, refers to a group represented by —$SA_3$ where $A_3$ is the substituted or unsubstituted $C_6$-$C_{60}$ aryl group.

EXAMPLES

Synthesis Example 1: Synthesis of Compound 1

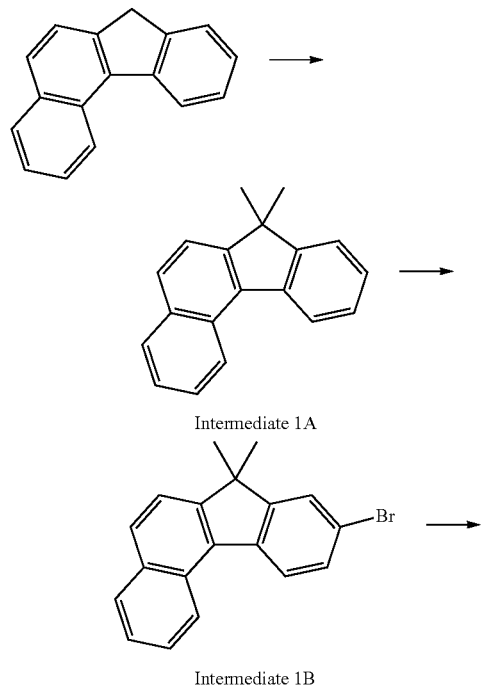

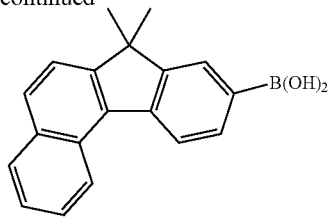

Intermediate 1C

Synthesis of Intermediate 1A 2.2 g (10 mmol) of 7H-benzo[c]fluorene was added to 10 mL of dimethylsulfoxide (DMSO) in a flask, and the mixture was stirred. An aqueous solution of 2.3 g (40 mmol) of potassium hydroxide dissolved in 5 mL of purified water was added to the flask at room temperature. Next, the temperature of the flask was cooled down to 0° C. in an ice-water bath, and then 1.9 mL (30 mmol) of iodomethane was slowly added to the flask. Then, a temperature of the flask was slowly increased to room temperature, and the mixture was stirred overnight to achieve reaction. When the reaction was terminated, a concentrated hydrochloric acid aqueous solution was added to the flask to neutralize the reaction product. The solid produced therefrom was filtered, and then dissolved in dichloromethane followed by drying with anhydrous magnesium sulfate and filtering the resultant again. The filtrate obtained therefrom was concentrated and recrystallized using dichloromethane and methanol to obtain 1.78 g of Intermediate 1A (yield: 73%).

Synthesis of Intermediate 1B 1.5 g (6.1 mmol) of Intermediate 1A was added to 10 mL of dichloromethane in a flask, the mixture was stirred, and then a solution including 0.34 mL (6.4 mmol) of bromine dissolved in 10 mL of dichloromethane was slowly added to the flask at a temperature of 0° C. The temperature of the flask was increased to room temperature, and then the mixture was stirred overnight to achieve reaction. When the reaction was terminated, the resultant in the flask was washed with a saturated aqueous solution of sodium hydrogencarbonate. The organic layer was separated from the flask, dried with anhydrous magnesium, and then filtered. The filtrate obtained therefrom was concentrated and recrystallized using dichloromethane and methanol to obtain 1.75 g of Intermediate 1B (yield: 89%) as a white solid compound.

Synthesis of Intermediate 1C 1.5 g (4.6 mmol) of Intermediate 1B was added to 800 mL of tetrahydrofuran at room temperature. Next, the temperature of the flask was cooled to −78° C., 3.2 mL (5.1 mmol) of n-butyl lithium was slowly added to the flask at the same temperature, and 1.8 mL (7.65 mol) of triisopropyl borate was added to the flask at the same temperature. Then, the temperature of the flask was slowly increased overnight to achieve reaction. When the reaction was terminated, a 1N-hydrochloric acid aqueous solution was added to the flask until the pH of the mixture in the flask became 2, and thus the resultant was acidified. The acidified resultant was extracted with ethylacetate, and the organic layer was washed with purified water. The organic layer was separated, dried with anhydrous magnesium, and then filtered and then the filtrate was concentrated and recrystallized using dichloromethane and n-hexane to obtain 1.09 g of Intermediate 1C (yield: 82%) as a white solid compound.

<Reaction Scheme 2>

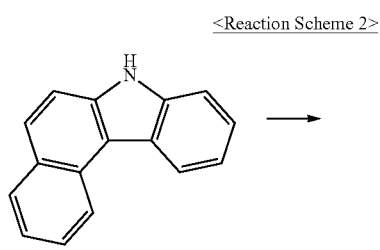

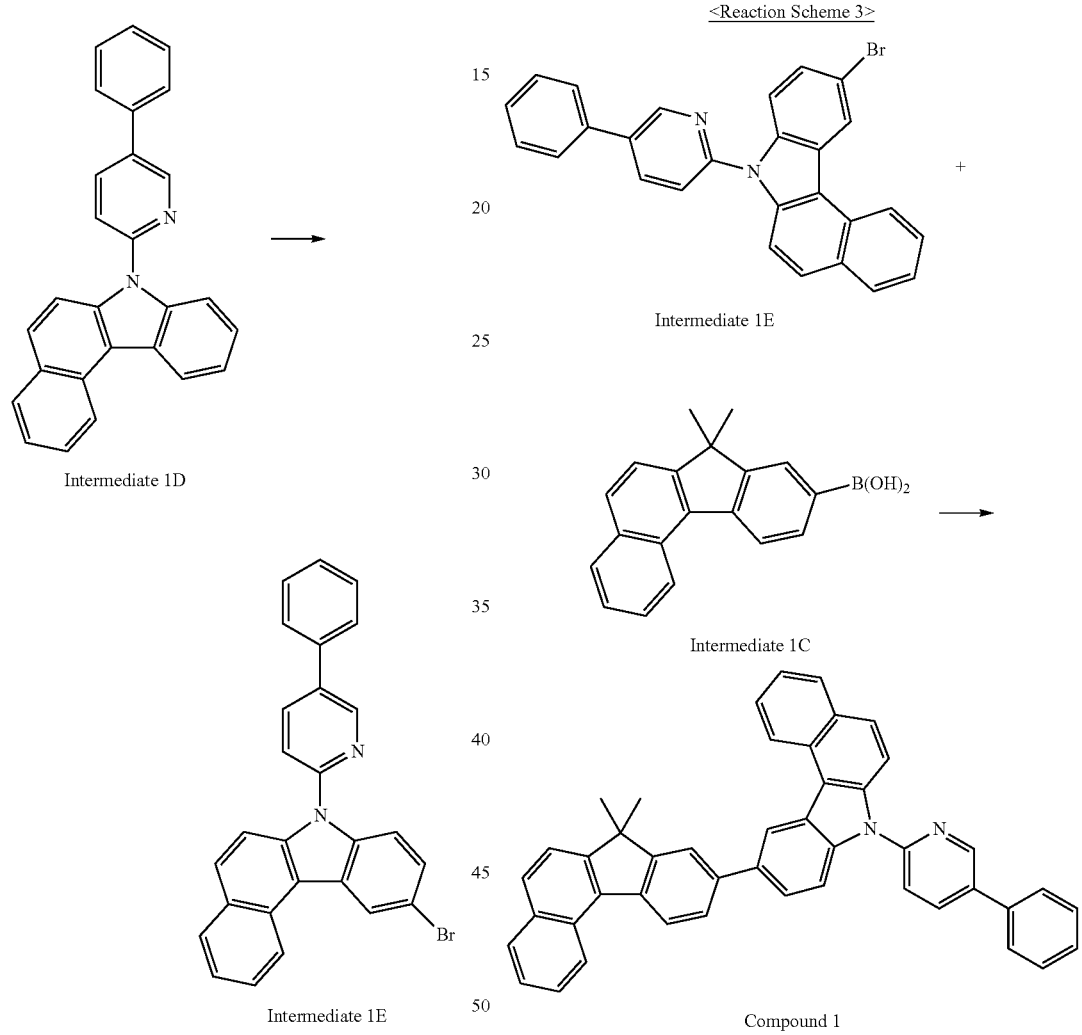

Synthesis of Intermediate 1D 2.17 g (10 mmol) of 7H-benzo[c]carbazole, 2.28 g (122 mmol) of 2-chloro-5-phenylpyridine, 0.12 g of Pd(OAc)$_2$, 1.92 g (20 mmol) of NaOt-bu, 20 mL of toluene, and 0.4 mL (1 mmol, 50% in toluene) of P(t-bu)$_3$ were mixed and stirred. After 10 hours, the mixture was cooled to room temperature, and distilled water was added thereto. Then, the mixture was extracted using ethyl acetate (EA), dried using anhydrous MgSO$_4$, dried under a reduced pressure, and then purified through a column to obtain 2.96 g of Intermediate 11D (yield: 82%).

Synthesis of Intermediate 1E 2.5 g (6.7 mmol) of Intermediate 1D was added to a single-neck flask, a vacuum-atmosphere was established in the flask, and then the flask was filled with argon. 50 mL of THF was added to the flask and stirred for 10 minutes at 0° C. Then, 1.43 g (8.1 mmol) of NBS was added, stirred for one day at room temperature, and when the reaction was terminated, the resultant was extracted using distilled water and EA. The organic layer obtained therefrom was dried using anhydrous MgSO$_4$, the solvent was removed using a rotary evaporator, and purified by column chromatography with hexane and EA as the developing solvent to obtain 2.35 g of Intermediate 1E (yield: 78%).

Synthesis of Compound 1

Under a nitrogen atmosphere, 2.25 g (5 mmol) of Intermediate 1E, 1.73 g (6 mmol) of Intermediate 1C, 0.23 g (0.2 mmol) of Pd(PPh$_3$)$_4$, 6 mL of 2M K$_2$CO$_3$ aqueous solution, 25 mL of toluene, and 13 mL of ethanol were mixed, refluxed for 12 hours, washed with distilled water, extracted using EA, dried using anhydrous MgSO$_4$, dried under a reduced pressure, and then purified through a column to obtain 1.93 g of Compound 1(yield: 63%).

H-NMR (CDCl$_3$, 300 MHz, ppm): 8.6-8.6 (m, 3H), 8.2-8.1 (m, 4H), 8.0-7.8 (m, 6H), 7.7-7.6 (m, 5H), 7.5-7.4 (m, 7H), 7.1 (d, 1H), 1.8 (s, 6H)

MS (MALDI-TOF) m/z: 612 [M]+

Synthesis Example 2: Synthesis of Compound 2

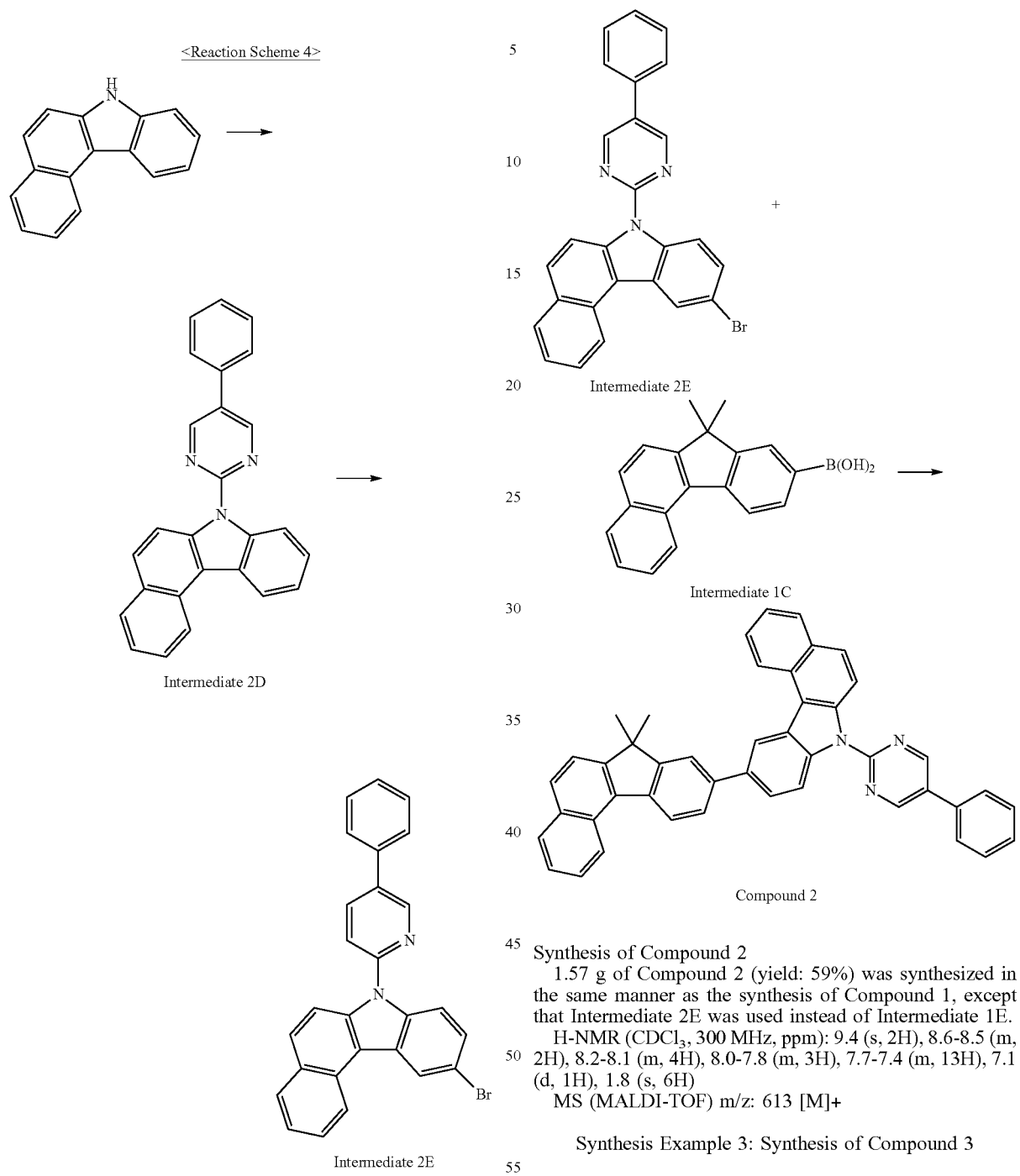

Synthesis of Compound 2

1.57 g of Compound 2 (yield: 59%) was synthesized in the same manner as the synthesis of Compound 1, except that Intermediate 2E was used instead of Intermediate 1E.

H-NMR (CDCl$_3$, 300 MHz, ppm): 9.4 (s, 2H), 8.6-8.5 (m, 2H), 8.2-8.1 (m, 4H), 8.0-7.8 (m, 3H), 7.7-7.4 (m, 13H), 7.1 (d, 1H), 1.8 (s, 6H)

MS (MALDI-TOF) m/z: 613 [M]+

Synthesis Example 3: Synthesis of Compound 3

<Reaction Scheme 6>

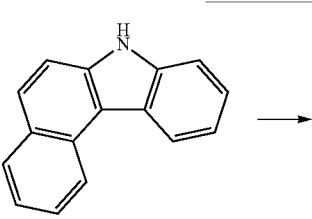

Synthesis of Intermediate 2D

Intermediate 2D was synthesized in the same manner as the synthesis of Intermediate 1D, except that 2-bromo-5-phenylpyrimidine was used instead of 2-chloro-5-phenylpyridine.

Synthesis of Intermediate 2E

Intermediate 2E was synthesized in the same manner as the synthesis of Intermediate 1E, except that Intermediate 2D was used instead of Intermediate 1D.

-continued

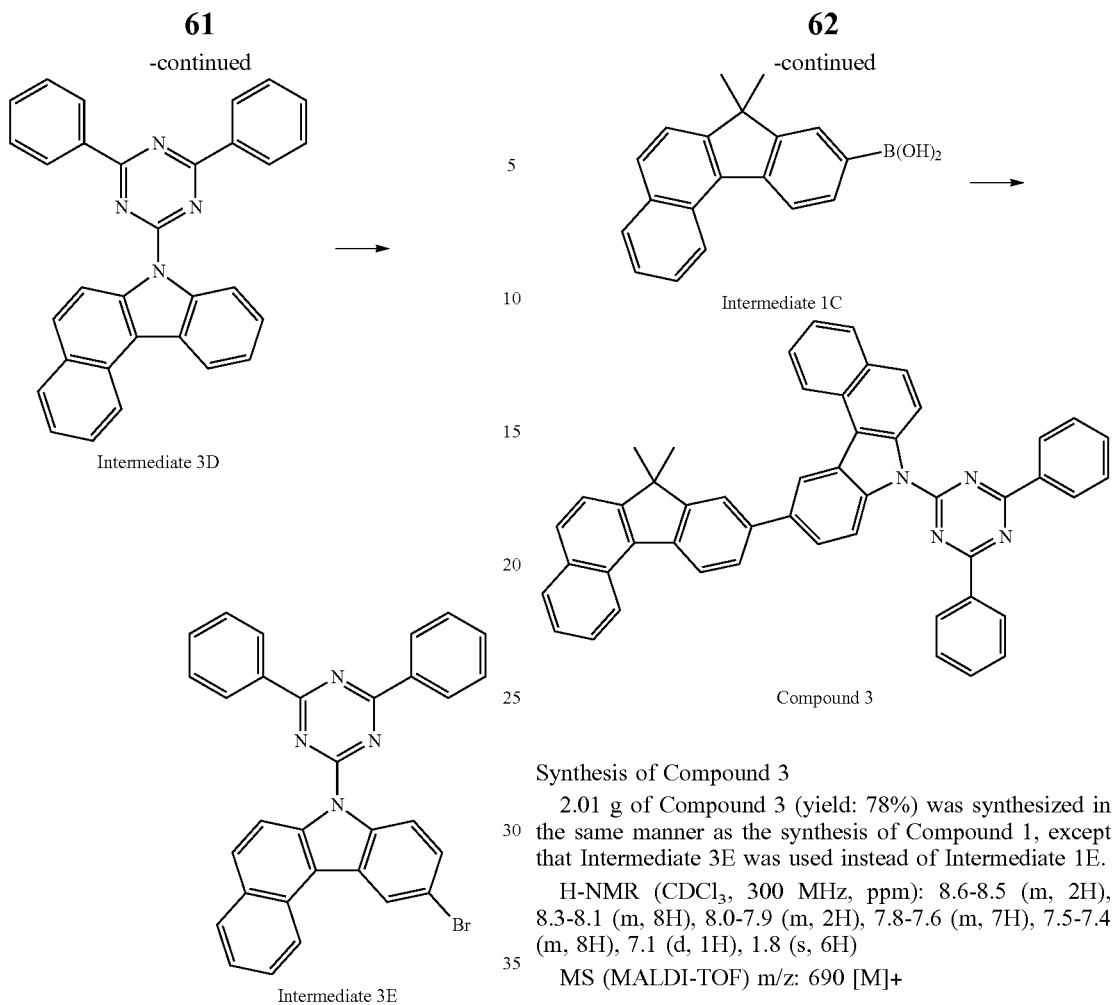

Intermediate 3D

Intermediate 1C

Compound 3

Synthesis of Compound 3

2.01 g of Compound 3 (yield: 78%) was synthesized in the same manner as the synthesis of Compound 1, except that Intermediate 3E was used instead of Intermediate 1E.

H-NMR (CDCl$_3$, 300 MHz, ppm): 8.6-8.5 (m, 2H), 8.3-8.1 (m, 8H), 8.0-7.9 (m, 2H), 7.8-7.6 (m, 7H), 7.5-7.4 (m, 8H), 7.1 (d, 1H), 1.8 (s, 6H)

MS (MALDI-TOF) m/z: 690 [M]+

Synthesis Example 4: Synthesis of Compound 5

<Reaction Scheme 8>

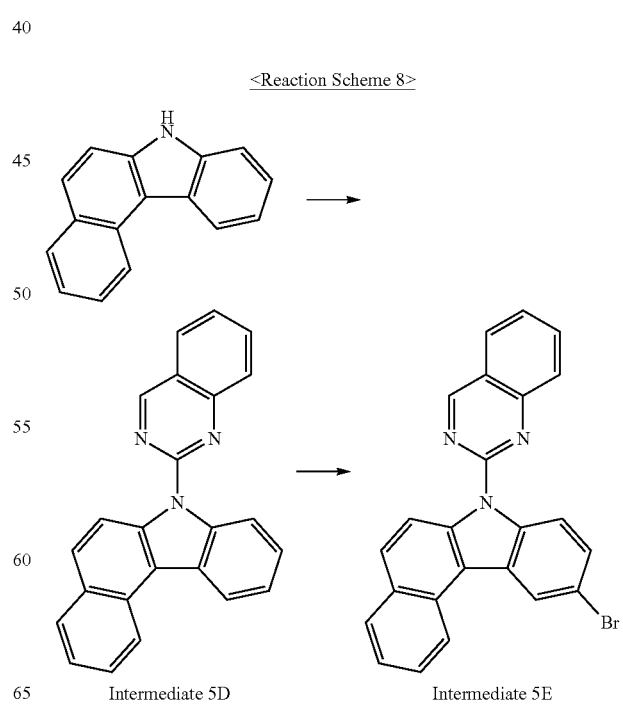

Intermediate 5D     Intermediate 5E

Synthesis of Intermediate 3D

Intermediate 3D was synthesized in the same manner as the synthesis of Intermediate 1D, except that 2-chloro-4,6-diphenyl-1,3,5-triazine was used instead of 2-chloro-5-phenylpyridine.

Synthesis of Intermediate 3E

Intermediate 3E was synthesized in the same manner as the synthesis of Intermediate 1E, except that Intermediate 3D was used instead of Intermediate 1D.

<Reaction Scheme 7>

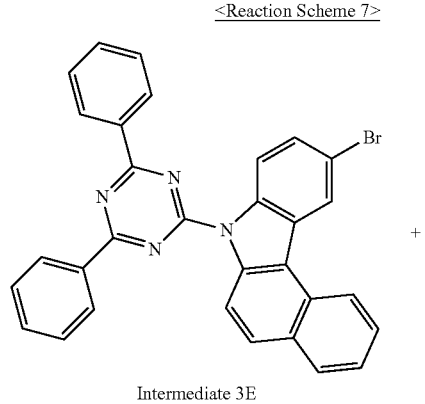

Intermediate 3E

Synthesis of Intermediate 5D

Intermediate 5D was synthesized in the same manner as the synthesis of Intermediate 1D, except that 2-chloroquinazoline was used instead of 2-chloro-5-phenylpyridine.

Synthesis of Intermediate 5E

Intermediate 5E was synthesized in the same manner as the synthesis of Intermediate 1E, except that Intermediate 5D was used instead of Intermediate 1D.

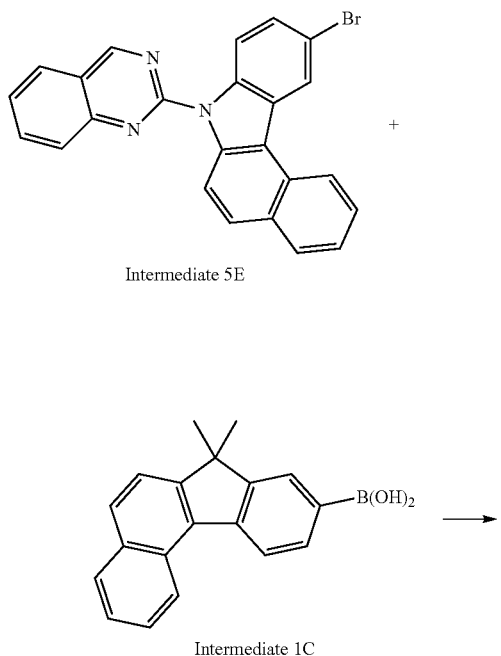

Intermediate 1C

Compound 5

Synthesis of Compound 5

1.88 g of Compound 5 (yield: 67%) was synthesized in the same manner as the synthesis of Compound 1, except that Intermediate 5E was used instead of Intermediate 1E.

H-NMR (CDCl$_3$, 300 MHz, ppm): 9.7 (s, 1H), 8.6-8.5 (m, 2H), 8.2-8.0 (m, 9H), 7.8-7.7 (m, 3H), 7.6-7.5 (m, 7H), 7.1 (d, 1H), 1.8 (s, 6H)

MS (MALDI-TOF) m/z: 587 [M]+

Synthesis Example 5: Synthesis of Compound 6

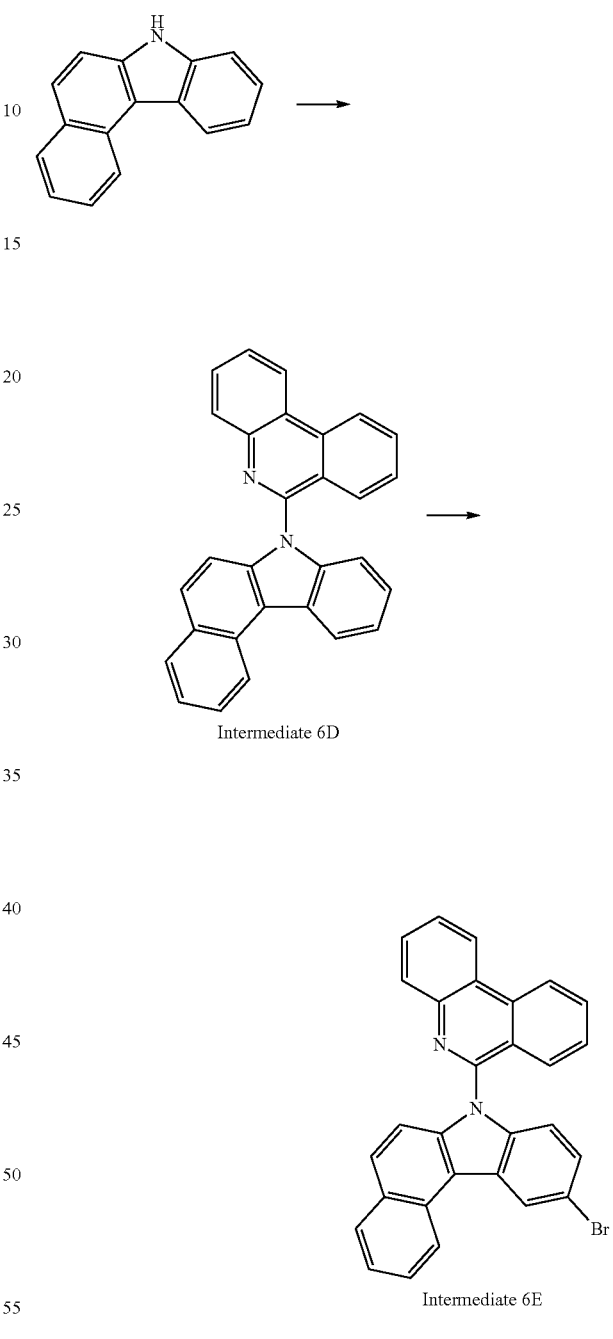

Synthesis of Intermediate 6D

Intermediate 6D was synthesized in the same manner as the synthesis of Intermediate 1D, except that 6-bromophenanthridine was used instead of 2-chloro-5-phenylpyridine.

Synthesis of Intermediate 6E

Intermediate 6E was synthesized in the same manner as the synthesis of Intermediate 1E, except that Intermediate 6D was used instead of Intermediate 1D.

<Reaction Scheme 11>

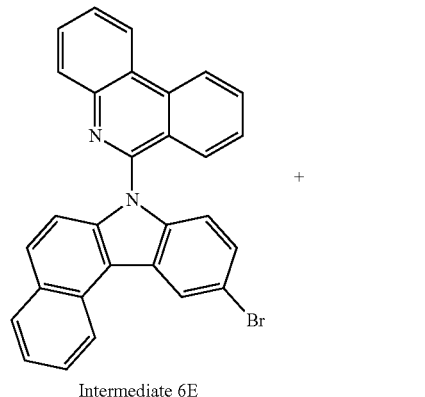

Intermediate 6E

+

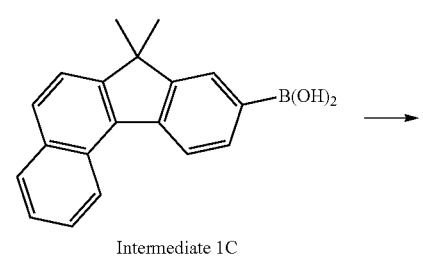

Intermediate 1C

→

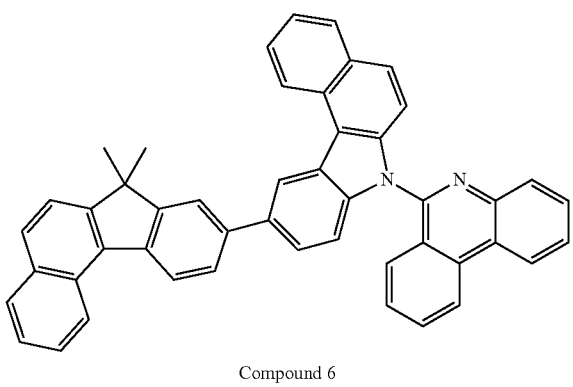

Compound 6

Synthesis of Compound 6

1.65 g of Compound 6 (yield: 61%) was synthesized in the same manner as the synthesis of Compound 1, except that Intermediate 6E was used instead of Intermediate 1E.

H-NMR (CDCl$_3$, 300 MHz, ppm): 8.6-8.5 (m, 2H), 8.2-8.0 (m, 9H), 7.8-7.4 (m, 14H), 7.1 (d, 1H), 1.8 (s, 6H)

MS (MALDI-TOF) m/z: 636 [M]+

Synthesis Example 6: Synthesis of Compound 10

<Reaction Scheme 12>

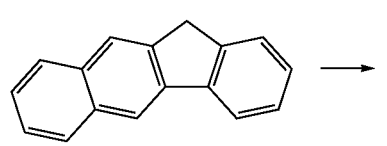

→

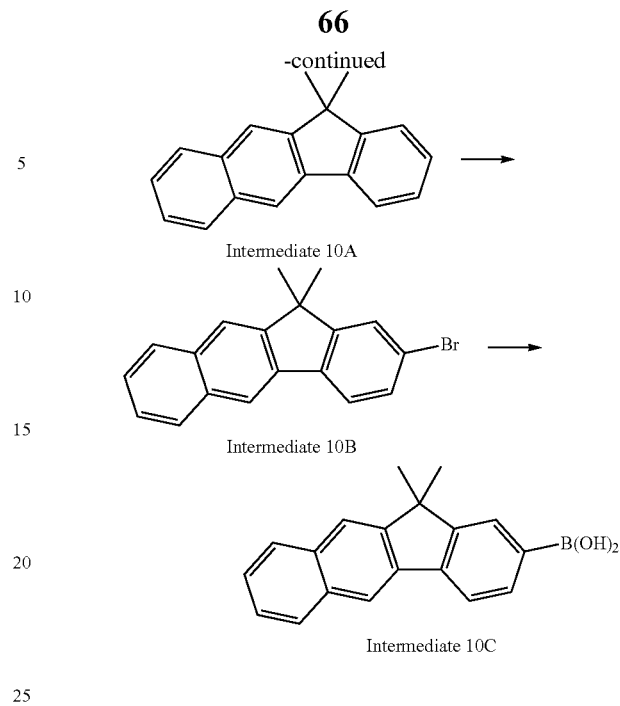

Intermediate 10A Intermediate 10B Intermediate 10C

Synthesis of Intermediate 10A

Intermediate 10A was synthesized in the same manner as the synthesis of Intermediate 1A, except that 11H-benzo[b]fluorene was used instead of 7H-benzo[c]fluorene.

Synthesis of Intermediate 10B

Intermediate 10B was synthesized in the same manner as the synthesis of Intermediate 1B, except that Intermediate 10A was used instead of Intermediate 1A.

Synthesis of Intermediate 10C

Intermediate 10C was synthesized in the same manner as the synthesis of Intermediate 1C, except that Intermediate 10B was used instead of Intermediate 1B.

<Reaction Scheme 13>

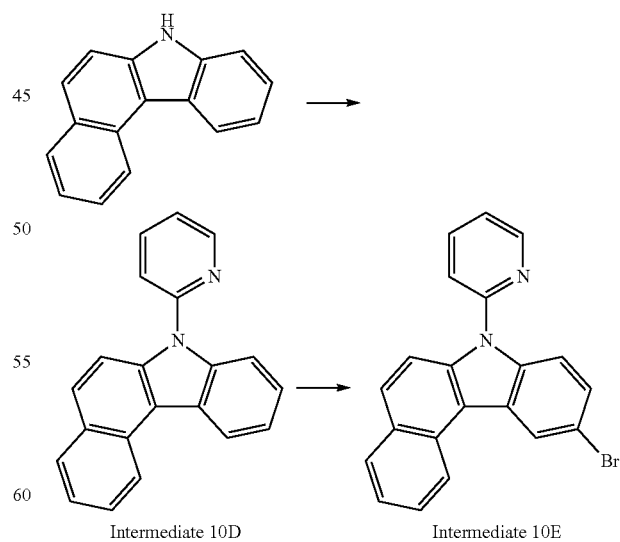

Synthesis of Intermediate 10D

Intermediate 10D was synthesized in the same manner as the synthesis of Intermediate 1D, except that 2-bromopyridine was used instead of 2-chloro-5-phenylpyridine.

Synthesis of Intermediate 10E

Intermediate 10E was synthesized in the same manner as the synthesis of Intermediate 1E, except that Intermediate 10D was used instead of Intermediate 1D.

<Reaction Scheme 14>

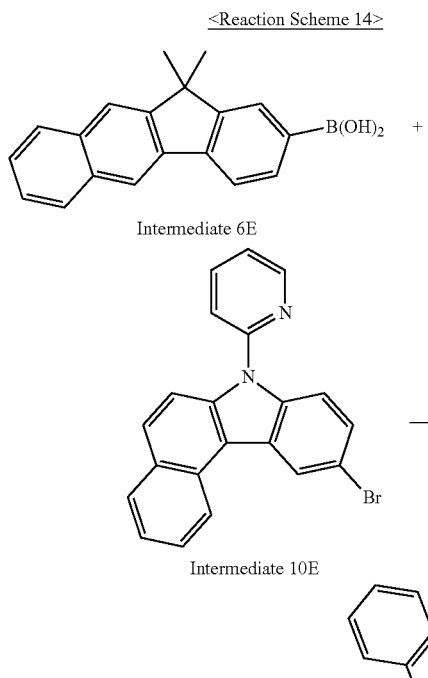

Intermediate 6E

Intermediate 10E

Compound 10

Synthesis of Compound 10

2.32 g of Compound 10 (yield: 75%) was synthesized in the same manner as the synthesis of Compound 1, except that Intermediate 10C was used instead of Intermediate 1C, and Intermediate 10E was used instead of Intermediate 1E.

H-NMR (CDCl$_3$, 300 MHz, ppm): 8.5-8.4 (m, 2H), 8.3-8.2 (m, 4H), 8.0-7.8 (m, 6H), 7.7-7.5 (m, 10H), 1.8 (s, 6H)

MS (MALDI-TOF) m/z: 536 [M]+

Synthesis Example 7: Synthesis of Compound 12

<Reaction Scheme 15>

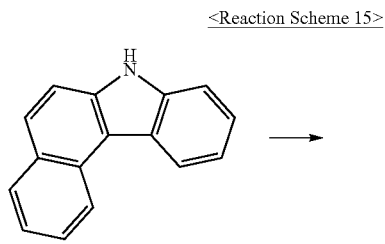

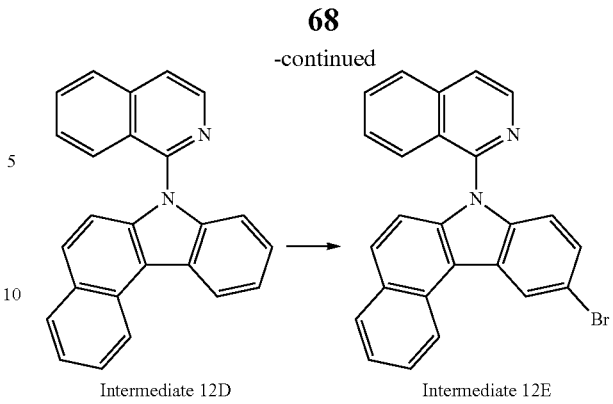

Intermediate 12D       Intermediate 12E

Synthesis of Intermediate 12D

Intermediate 12D was synthesized in the same manner as the synthesis of Intermediate 1D, except that 2-chloroquinoline was used instead of 2-chloro-5-phenylpyridine.

Synthesis of Intermediate 12E

Intermediate 12E was synthesized in the same manner as the synthesis of Intermediate 1E, except that Intermediate 12D was used instead of Intermediate 1D.

<Reaction Scheme 16>

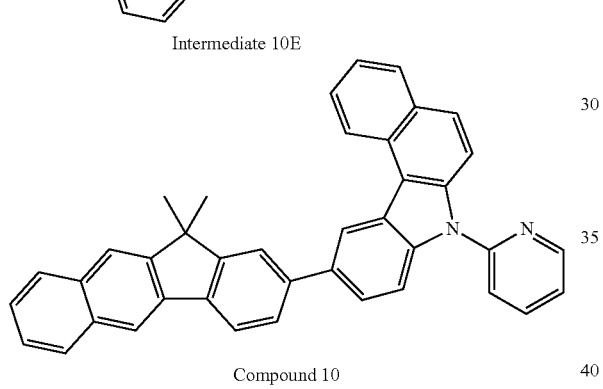

Intermediate 10C

Intermediate 12E

Compound 12

Synthesis of Compound 12

2.16 g of Compound 12 (yield: 71%) was synthesized in the same manner as the synthesis of Compound 10, except that Intermediate 12E was used instead of Intermediate 10E.

H-NMR (CDCl$_3$, 300 MHz, ppm): 8.5-8.3 (m, 2H), 8.2-8.1 (m, 4H), 8.0-7.8 (m, 6H), 7.7-7.4 (m, 12H), 1.8 (s, 6H)

MS (MALDI-TOF) m/z: 586 [M]+

Synthesis Example 8: Synthesis of Compound 15

<Reaction Scheme 17>

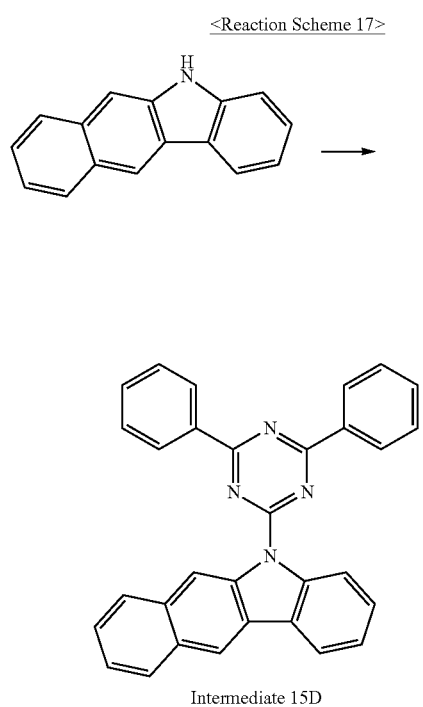

Intermediate 15D

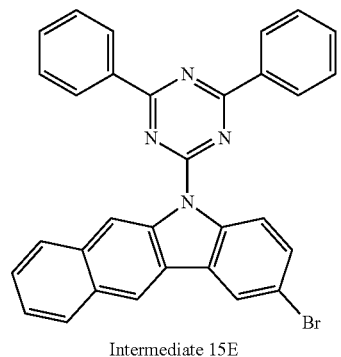

Intermediate 15E

Synthesis of Intermediate 15D

Intermediate 15D was synthesized in the same manner as the synthesis of Intermediate 3D, except that 5H-benzo[b]carbazole was used instead of 7H-benzo[c]carbazole.

Synthesis of Intermediate 15E

Intermediate 15E was synthesized in the same manner as the synthesis of Intermediate 3E, except that Intermediate 15D was used instead of Intermediate 3D.

<Reaction Scheme 18>

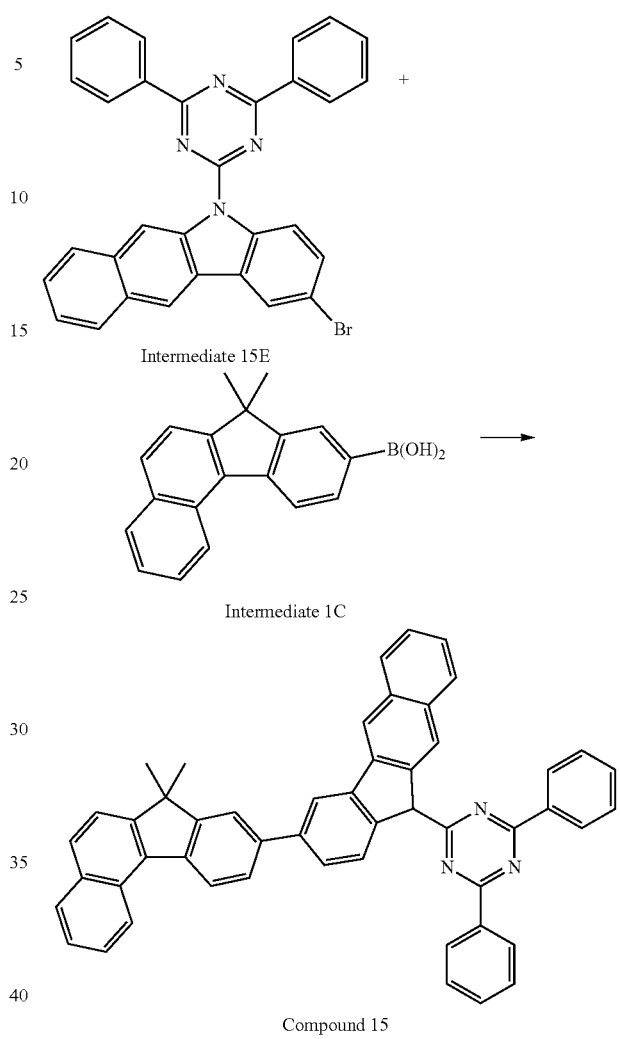

Compound 15

Synthesis of Compound 15

2.40 g of Compound 15 (yield: 72%) was synthesized in the same manner as the synthesis of Compound 1, except that Intermediate 15E was used instead of Intermediate 1E.

H-NMR (CDCl$_3$, 300 MHz, ppm): 8.5-8.3 (m, 5H), 8.2-8.0 (m, 7H), 7.8-7.7 (m, 5H), 7.5-7.4 (m, 10H), 7.1 (d, 1H), 1.8 (s, 6H)

MS (MALDI-TOF) m/z: 690 [M]+

Example 1

As an anode, an ITO (1200 Å) glass substrate was cut to a size of 50 mm×50 mm×0.5 mm, sonicated using isopropyl alcohol and pure water for 5 minutes each, and then cleaned by irradiation with UV rays for 30 minutes and exposure to ozone. The resulting glass substrate was disposed in a vacuum deposition apparatus.

Then, m-MTDATA was deposited on the anode to form a HIL having a thickness of 600 Å, and then α-NPD was deposited on the HIL to form a HTL having a thickness of 300 Å.

Compound 1 (host) and Ir(piq)$_3$ (dopant) were each deposited on the HTL at a deposition rate of 1 Å/sec and 0.1 Å/sec, respectively, to form an EML having a thickness of 200 Å. Then, Alq₃ was deposited on the EML to form an ETL having a thickness of 300 Å, and LiF was deposited on the ETL to form an EIL having a thickness of 10 Å. Then, Al was deposited on the EIL to form a cathode having a thickness of 2000 Å, and as a result, an organic light-emitting diode was prepared.

Example 2

An organic light-emitting diode was manufactured in the same manner as Example 1, except that Compound 2 was used instead of Compound 1 as a host in the EML.

Example 3

An organic light-emitting diode was manufactured in the same manner as Example 1, except that Compound 3 was used instead of Compound 1 as a host in the EML.

Example 4

An organic light-emitting diode was manufactured in the same manner as Example 1, except that Compound 5 was used instead of Compound 1 as a host in the EML.

Example 5

An organic light-emitting diode was manufactured in the same manner as Example 1, except that Compound 6 was used instead of Compound 1 as a host in the EML.

Example 6

An organic light-emitting diode was manufactured in the same manner as Example 1, except that Compound 10 was used instead of Compound 1 as a host in the EML.

Example 7

An organic light-emitting diode was manufactured in the same manner as Example 1, except that Compound 12 was used instead of Compound 1 as a host in the EML.

Example 8

An organic light-emitting diode was manufactured in the same manner as Example 1, except that Compound 15 was used instead of Compound 1 as a host in the EML.

Comparative Example 1

An organic light-emitting diode was manufactured in the same manner as Example 1, except that CBP was used instead of Compound 1 as a host in the EML.

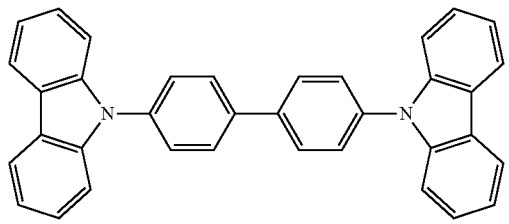

CBP

Comparative Example 2

An organic light-emitting diode was manufactured in the same manner as Example 1, except that Compound A was used instead of Compound 1 as a host in the EML.

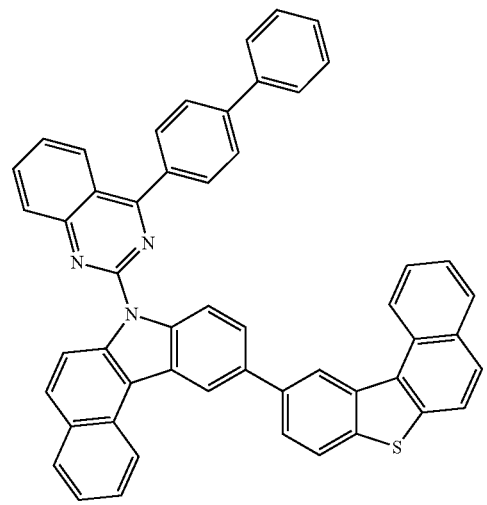

<Compound A>

Comparative Example 3

An organic light-emitting diode was manufactured in the same manner as Example 1, except that Compound B was used instead of Compound 1 as a host in the EML.

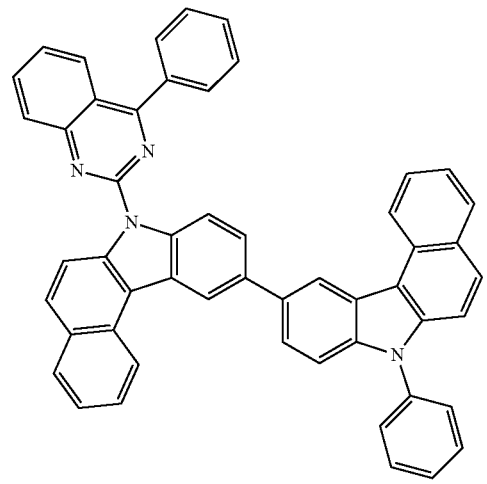

<Compound B>

Comparative Example 4

An organic light-emitting diode was manufactured in the same manner as Example 1, except that Compound C was used instead of Compound 1 as a host in the EML.

<Compound C>

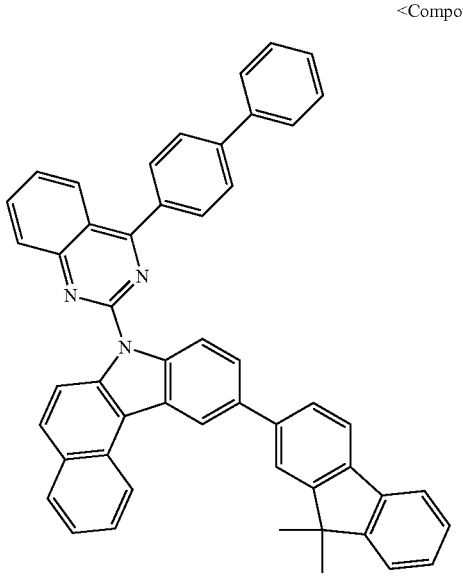

Comparative Example 5

An organic light-emitting diode was manufactured in the same manner as Example 1, except that Compound D was used instead of Compound 1 as a host in the EML.

<Compound D>

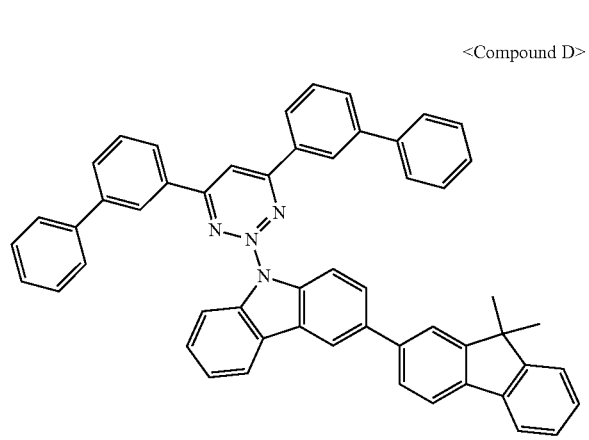

Comparative Example 6

An organic light-emitting diode was manufactured in the same manner as Example 1, except that Compound E was used instead of Compound 1 as a host in the EML.

<Compound E>

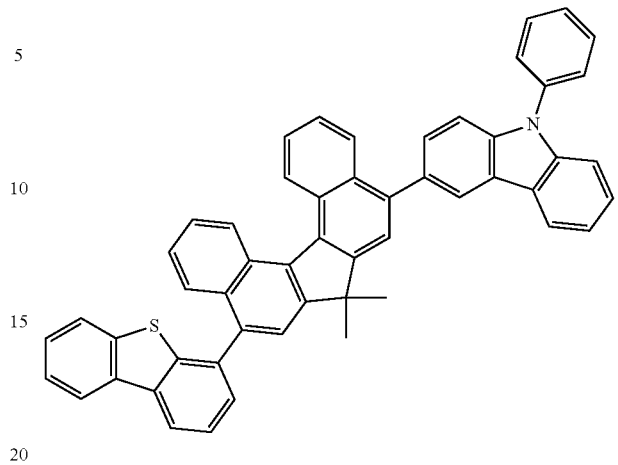

Evaluation Example 1

Driving voltage, efficiency, and color purity of the organic light-emitting diodes manufactured according to Examples 1 to 8 and Comparative Examples 1 to 6 were measured as described below, and the results are shown in Table 1.

Color coordinates were measured using a photometer PR650 with power supply from a current-voltmeter (Kethley SMU 236).

Efficiency was measured using a photometer PR650 with power supply from a current-voltmeter (Kethley SMU 236).

TABLE 1

| | Host | Driving voltage (V) | Efficiency (cd/A) | Color coordinates |
|---|---|---|---|---|
| Example 1 | Compound 1 | 5.3 | 17.7 | 0.659, 0.328 |
| Example 2 | Compound 2 | 4.8 | 16.8 | 0.658, 0.328 |
| Example 3 | Compound 3 | 5.0 | 18.1 | 0.658, 0.329 |
| Example 4 | Compound 5 | 4.7 | 18.6 | 0.659, 0.328 |
| Example 5 | Compound 6 | 5.7 | 16.3 | 0.657, 0.330 |
| Example 6 | Compound 10 | 5.2 | 15.2 | 0.651, 0.325 |
| Example 7 | Compound 12 | 5.5 | 15.5 | 0.653, 0.326 |
| Example 8 | Compound 15 | 4.8 | 17.1 | 0.658, 0.329 |
| Comparative Example 1 | CBP | 7.8 | 8.8 | 0.659, 0.328 |
| Comparative Example 2 | Compound A | 5.1 | 12.5 | 0.657, 0.329 |
| Comparative Example 3 | Compound B | 5.5 | 13.1 | 0.658, 0.327 |
| Comparative Example 4 | Compound C | 5.3 | 11.0 | 0.657, 0.330 |
| Comparative Example 5 | Compound D | 6.7 | 8.2 | 0.654, 0.325 |
| Comparative Example 6 | Compound E | 6.5 | 10.3 | 0.659, 0.328 |

Referring to Table 1, it was identified that the organic light-emitting diodes manufactured according to Examples 1 to 8 had lower driving voltage, higher efficiency, and higher color purity than the organic light-emitting diodes manufactured according to Comparative Examples 1 to 6.

While the present invention has been illustrated and described with reference to certain exemplary embodiments, those of ordinary skill in the art will understand that various changes can be made to the described embodiments without departing from the spirit and scope of the present invention as defined by the following claims.

What is claimed is:
1. A carbazole-based compound represented by one of Formula 1A(1), 1A(2), 1A(3), 1B(1), 1C(1), 1D(1), 1E(1), 1F(1), 1G(1), or 1H(1):
<Formula 1A(1)>
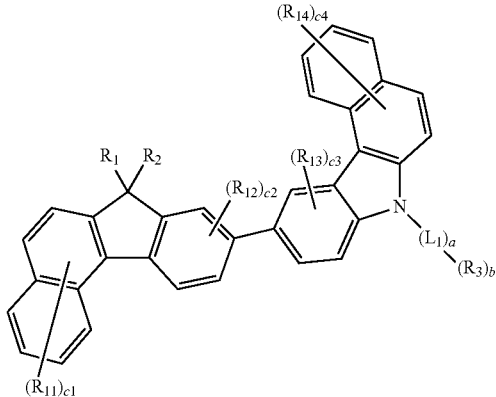
<Formula 1A(2)>
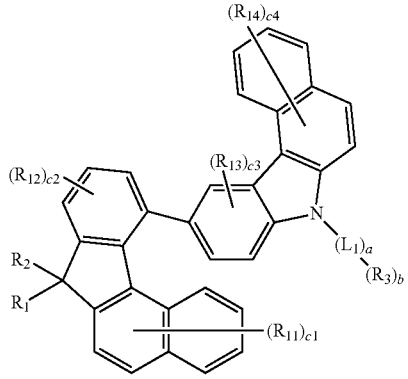
<Formula 1A(3)>
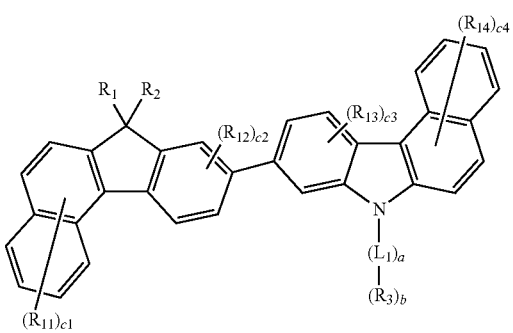
<Formula 1B(1)>
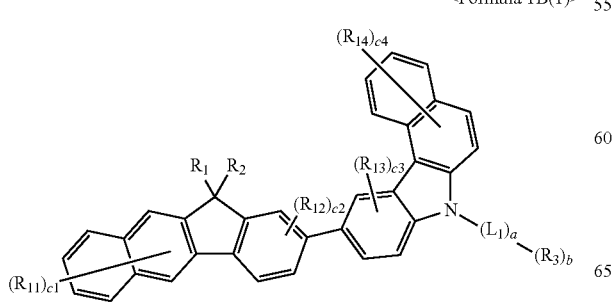
<Formula 1C(1)>
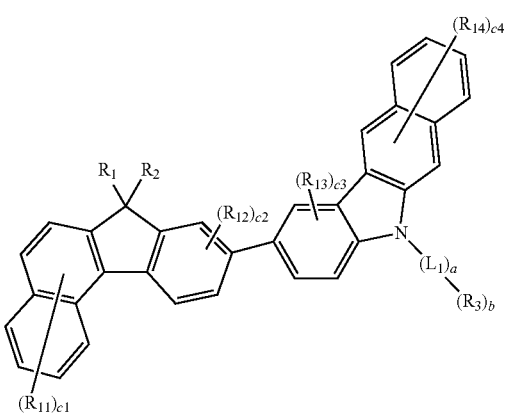
<Formula 1D(1)>
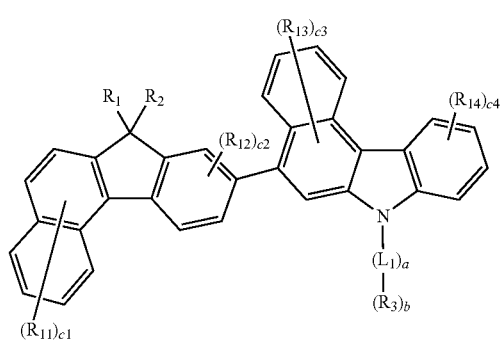
<Formula 1E(1)>
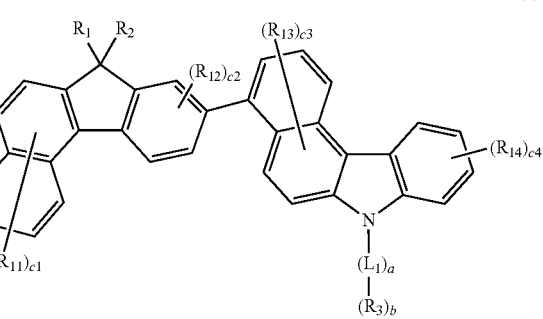
<Formula 1F(1)>
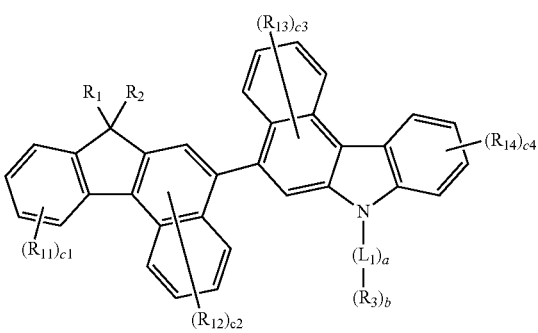

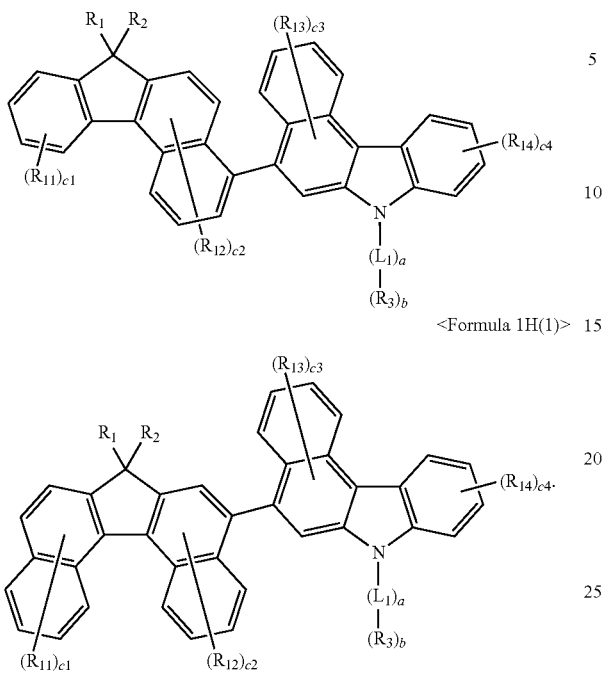

<Formula 1G(1)>

<Formula 1H(1)> wherein:
- $L_1$ is a substituted or unsubstituted $C_3$-$C_{10}$ cycloalkylene group, a substituted or unsubstituted $C_3$-$C_{10}$ heterocycloalkylene group, a substituted or unsubstituted $C_2$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;
- a is an integer from 0 to 5;
- $R_1$ and $R_2$ are each independently a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;
- $R_3$ and $R_{11}$ to $R_{14}$ are each independently a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_2$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), or —Si($Q_3$)($Q_4$)($Q_5$);
- $Q_1$ to $Q_5$ are each independently a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_3$-$C_{10}$ heterocycloalkyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group;
- b is an integer from 1 to 5; and
- c1, c2, c3, and c4 are each independently an integer from 1 to 8.

2. The carbazole-based compound of claim 1, wherein $L_1$ is:
- a phenylene group, a pentalenylene group, an indenylene group, a naphthylene group, an azulenylene, a heptalenylene group, an indacenylene group, an acenaphthylene group, a fluorenylene group, a spiro-fluorenylene group, a phenalenylene group, a phenanthrenylene group, an anthrylene group, a fluoranthenylene, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, or a benzocarbazolyl group; or
- a phenylene group, a pentalenylene group, an indenylene group, a naphthylene group, an azulenylene, a heptalenylene group, an indacenylene group, an acenaphthylene group, a fluorenylene group, a spiro-fluorenylene group, a phenalenylene group, a phenanthrenylene group, an anthrylene group, a fluoranthenylene, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, or a benzocarbazolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a dimethylfluorenyl group, a diphenylfluorenyl group, a spirofluorenyl group, a phenylcarbazolyl group, or —N($Q_{11}$)($Q_{12}$), wherein $Q_{11}$ and $Q_{12}$ are each independently a hydrogen atom, a $C_1$-$C_{10}$ alkyl group, a $C_6$-$C_{20}$ aryl group, or a $C_2$-$C_{20}$ heteroaryl group.

3. The carbazole-based compound of claim 1, wherein $L_1$ is:
 i) a phenylene group, a naphthylene group, a fluorenylene group, a pyridinylene group, a pyrazinylene group, a pyrimidinylene group, a pyridazinylene group, a quinolinylene group, an isoquinolinylene group, a phenanthridinylene group, a carbazolylene group, a triazinylene group, a dibenzofuranylene group, or a dibenzothiophenylene group; or
 ii) a phenylene group, a naphthylene group, a fluorenylene group, a pyridinylene group, a pyrazinylene group, a pyrimidinylene group, a pyridazinylene group, a quinolinylene group, an isoquinolinylene group, a phenanthridinylene group, a carbazolylene group, a triazinylene group, a dibenzofuranylene group, or a dibenzothiophenylene group, each of which is substituted with at least one substituent selected from a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

4. The carbazole-based compound of claim 1, wherein a is 1.

5. The carbazole-based compound of claim 1, wherein $R_1$ and $R_2$ are each independently:
 a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or
 a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or
 a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or
 a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each of which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group.

6. The carbazole-based compound of claim 1, wherein $R_3$ is:
 a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{20}$ alkoxy group; or
 a $C_1$-$C_{10}$ alkyl group or a $C_1$-$C_{20}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or
 a phenyl group, a pentalenylene group, an indenyl group, a naphthyl group, an azulenyl group, a heptalenyl group, an indacenyl, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, a benzocarbazolyl group, or an isoquinolyl group; or a phenyl group, a pentalenylene group, an indenyl group, a naphthyl group, an azulenyl group, a heptalenyl group, an indacenyl, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, a benzocarbazolyl group, or an isoquinolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, or a $C_2$-$C_{60}$ heteroaryl group.

7. The carbazole-based compound of claim 1, wherein $R_3$ is:
a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{20}$ alkoxy group; or
a $C_1$-$C_{10}$ alkyl group or a $C_1$-$C_{20}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group; or a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, an isoquinolyl group, or a dimethylfluorenyl group.

8. The carbazole-based compound of claim 1, wherein a

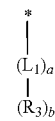

moiety of Formula 1A(1), 1A(2), 1A(3), 1B(1), 1C(1), 1D(1), 1E(1), 1F(1), 1G(1), or 1H(1) is represented by one of Formulae 2-1 to 2-7:

Formula 2-1

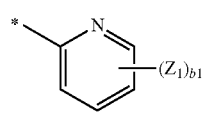

Formula 2-2

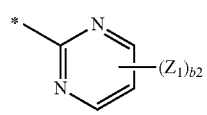

Formula 2-3

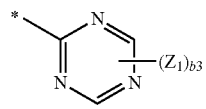

-continued

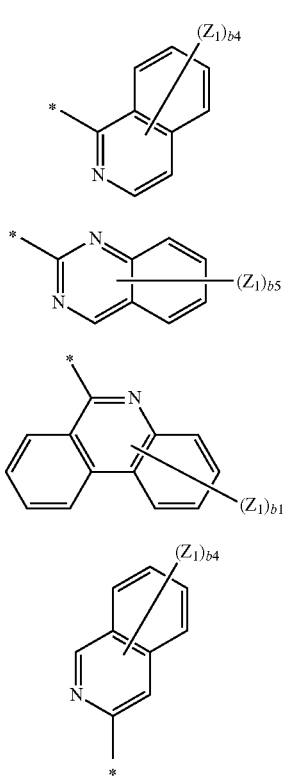

Formula 2-4

Formula 2-5

Formula 2-6

Formula 2-7 wherein:

Z₁ is:
- a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{20}$ alkoxy group; or
- a $C_1$-$C_{10}$ alkyl group or a $C_1$-$C_{20}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or
- a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group; or
- a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, an isoquinolyl group, or a dimethylfluorenyl group;

b1 is an integer from 1 to 4;

b2 is an integer from 1 to 3;

b3 is an integer from 1 to 2;

b4 is an integer from 1 to 6; and b5 is an integer from 1 to 5.

9. The carbazole-based compound of claim 1, wherein a

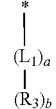

moiety in Formula 1A(1), 1A(2), 1A(3), 1B(1), 1C(1), 1D(1), 1E(1), 1F(1), 1G(1), or 1H(1) is represented by one of Formulae 3-1 to 3-14:

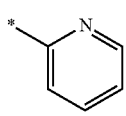

Formula 3-1

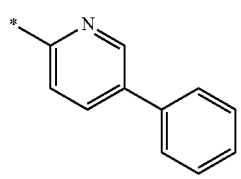

Formula 3-2

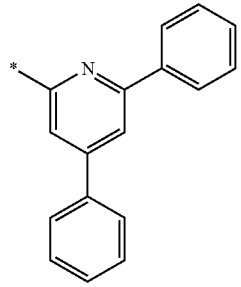

Formula 3-3

-continued

Formula 3-4

Formula 3-5

Formula 3-6

Formula 3-7

Formula 3-8

Formula 3-9

Formula 3-10

Formula 3-11

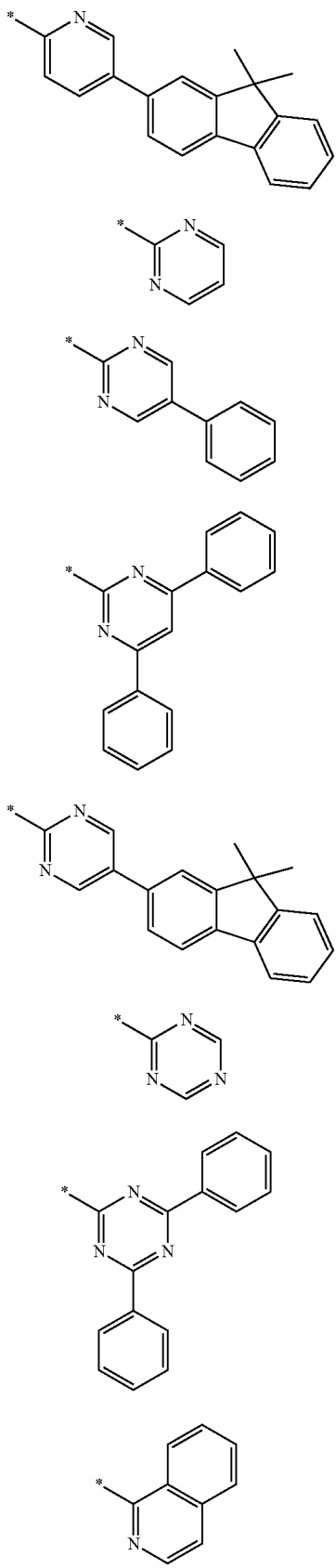

-continued

Formula 3-12

Formula 3-13

Formula 3-14

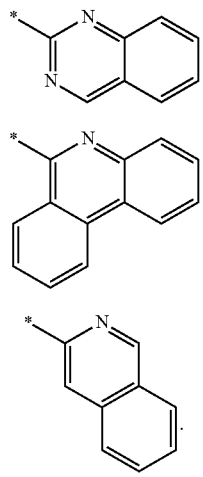

10. The carbazole-based compound of claim 1, wherein $R_{11}$ to $R_{14}$ are each independently:
   a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or
   a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or
   a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or
   a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each of which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group.

11. The carbazole-based compound of claim 1, wherein:
    $R_1$ and $R_2$ are each independently:
    a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each of which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group;

$R_{11}$ to $R_{14}$ are each independently:

a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group; or a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, or a pentoxy group, each of which is substituted with at least one of a deuterium atom, —F, a hydroxyl group, a cyano group, a nitro group, or an amino group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group, each of which is substituted with at least one of a deuterium atom, —F, a hydroxyl group, a cyano group, a nitro group, an amino group, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, or an anthryl group;

c1, c2, c3, and c4 are each independently an integer from 1 to 3;

a

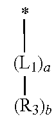

moiety is represented by one of Formulae 2-1 to 2-7:

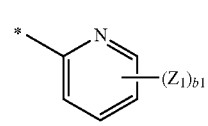

Formula 2-1

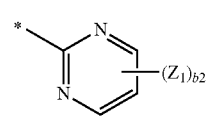

Formula 2-2

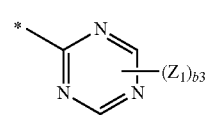

Formula 2-3

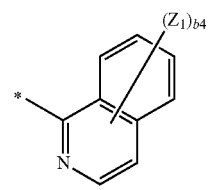

Formula 2-4

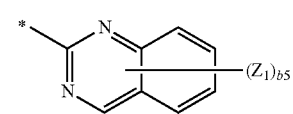

Formula 2-5

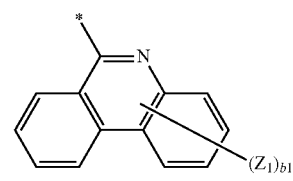

Formula 2-6

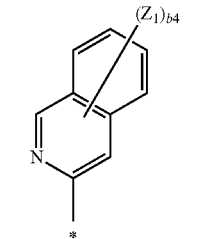

Formula 2-7

$Z_1$ is:
  a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{20}$ alkoxy group; or
  a $C_1$-$C_{10}$ alkyl group or a $C_1$-$C_{20}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or
  a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group; or
  a phenyl group, a naphthyl group, a fluorenyl group, a spiro-fluorenyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a quinazolinyl group, a carbazolyl group, a phenanthridinyl group, a triazinyl group, or an isoquinolyl group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a methyl group, an ethyl group, an n-propyl group, an i-propyl group, an n-butyl group, an i-butyl group, a t-butyl group, a pentyl group, a hexyl group, a heptyl group, an octyl group, a nonyl group, a decyl group, a methoxy group, an ethoxy group, a propoxy group, a butoxy group, a pentoxy group, a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, an isoquinolyl group, or a dimethylfluorenyl group;
b1 is an integer from 1 to 4;
b2 is an integer from 1 to 3;
b3 is an integer from 1 to 2;
b4 is an integer from 1 to 6; and
b5 is an integer from 1 to 5.

12. The carbazole-based compound of claim 1, wherein:
$R_1$ and $R_2$ are each independently:
  a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group; or
  a methyl group, an ethyl group, an n-propyl group, an i-propyl group, an n-butyl group, an i-butyl group, a t-butyl group, a pentyl group, a hexyl group, a heptyl group, an octyl group, a nonyl group, or a decyl group, each of which is substituted with at least one of a deuterium atom, —F, a hydroxyl group, a cyano group, a nitro group, or an amino group; or
  a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group;
each of $R_{11}$ to $R_{14}$ is a hydrogen atom; and
a

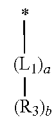

moiety is represented by one of Formulae 3-1 to 3-14:

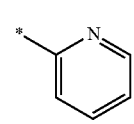
Formula 3-1

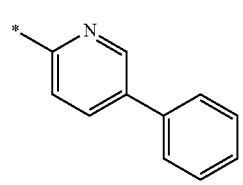
Formula 3-2

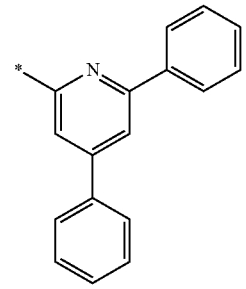
Formula 3-3

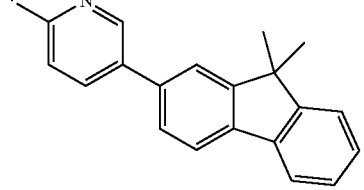
Formula 3-4

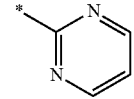
Formula 3-5

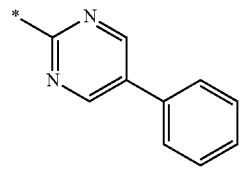
Formula 3-6

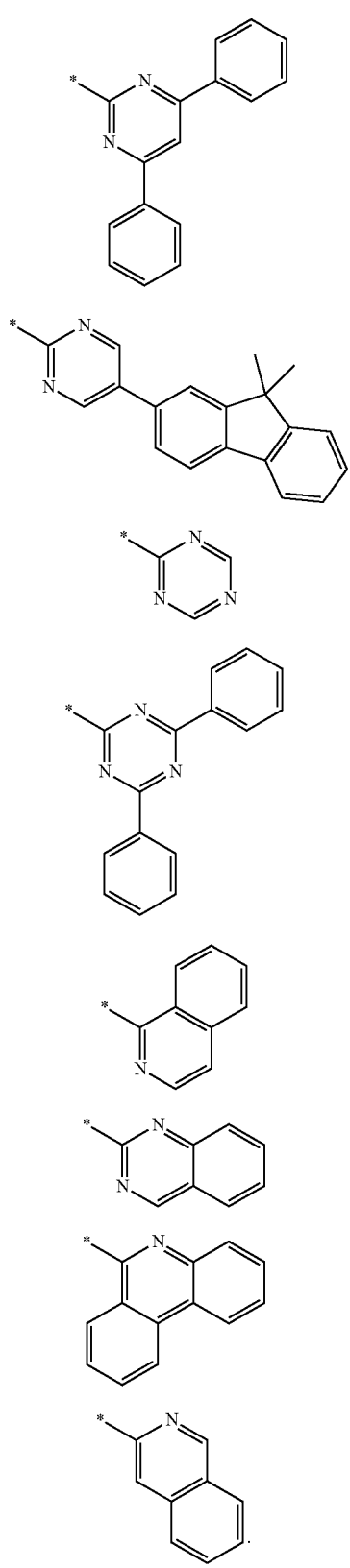
Formula 3-7
Formula 3-8
Formula 3-9
Formula 3-10
Formula 3-11
Formula 3-12
Formula 3-13
Formula 3-14
13. The carbazole-based compound of claim 1, wherein the carbazole-based compound is one of Compounds 1 to 27:

93
-continued
5
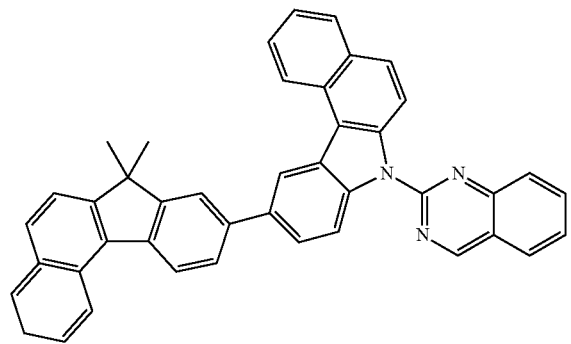
6
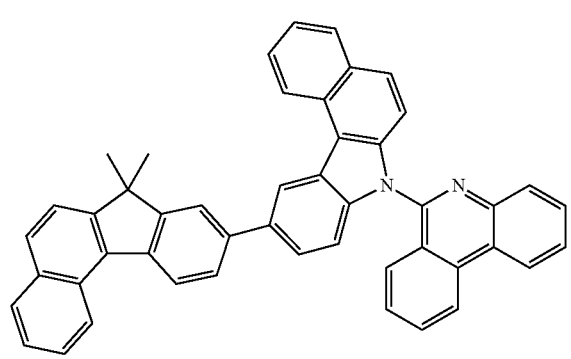
7
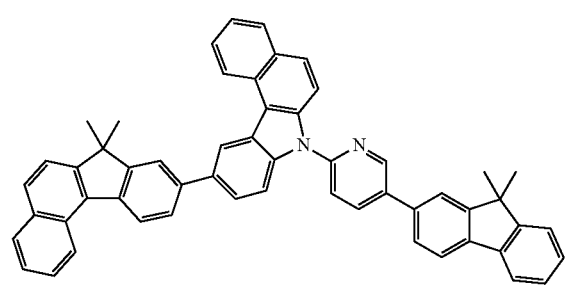
8
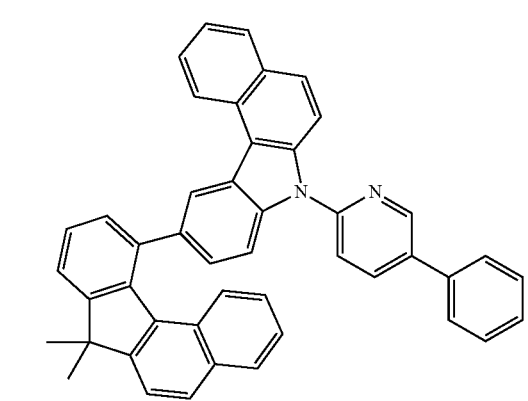
94
-continued
9
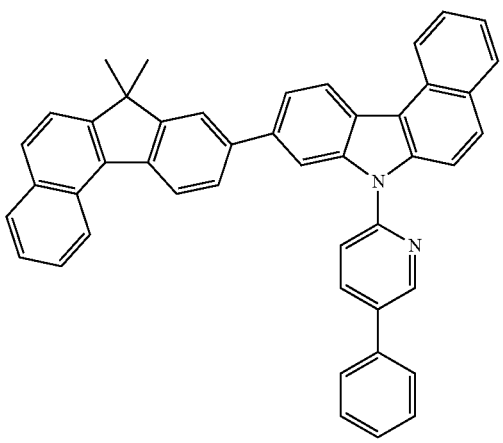
10
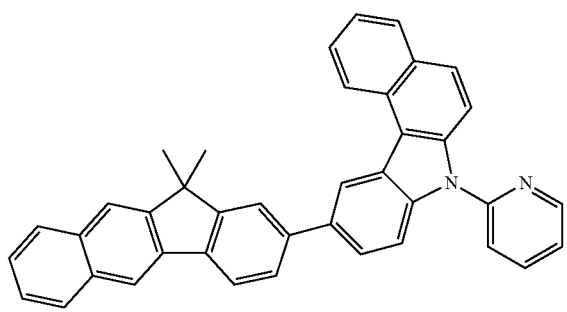
11
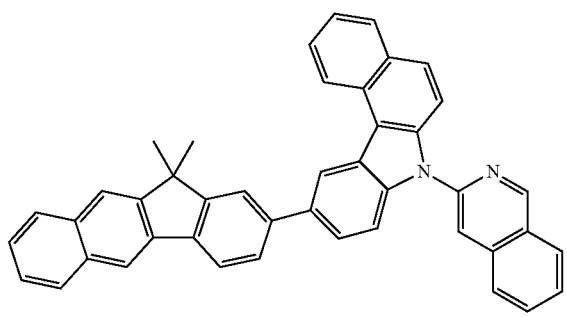
12
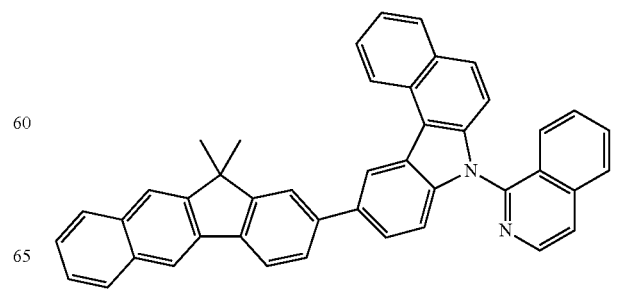

13
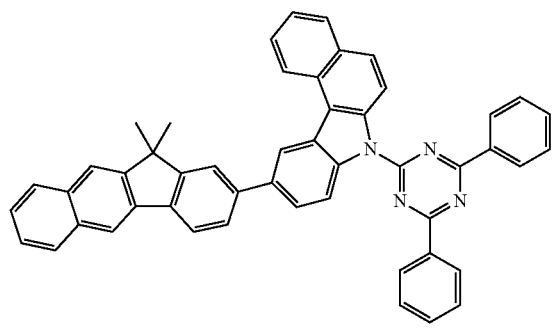
14
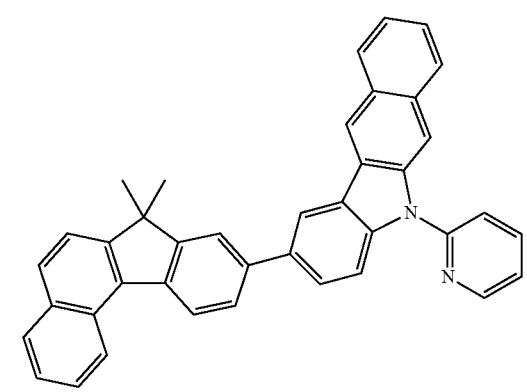
15
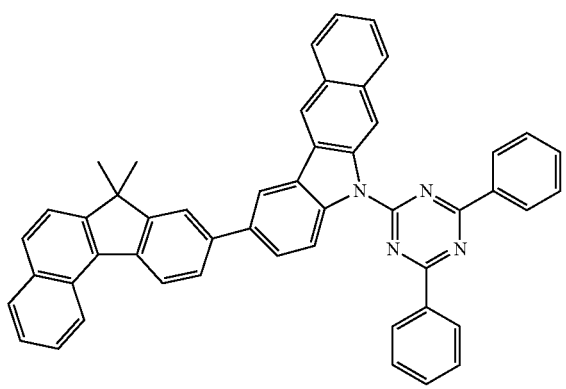
16
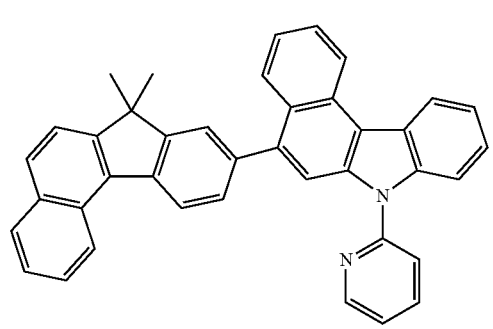
17
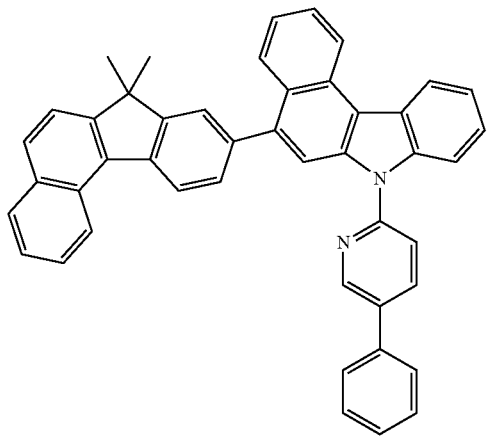
18
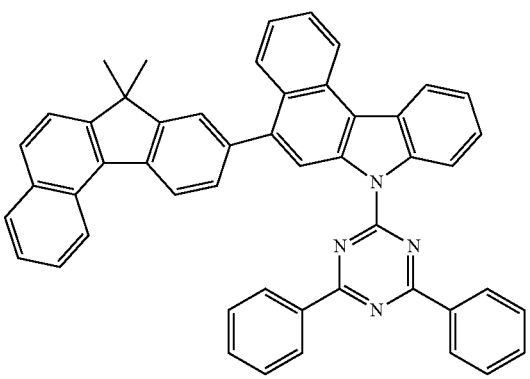
19
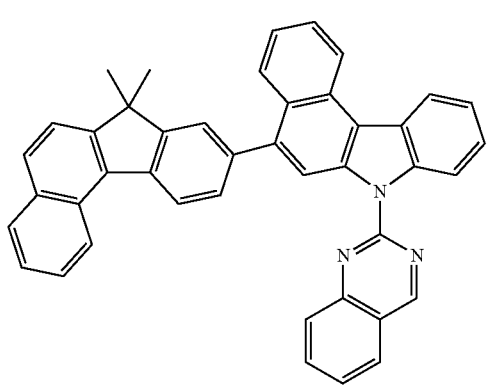
20
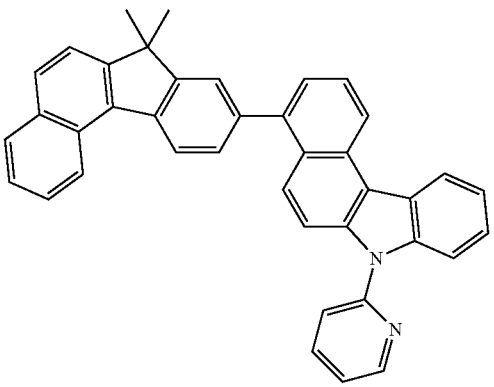

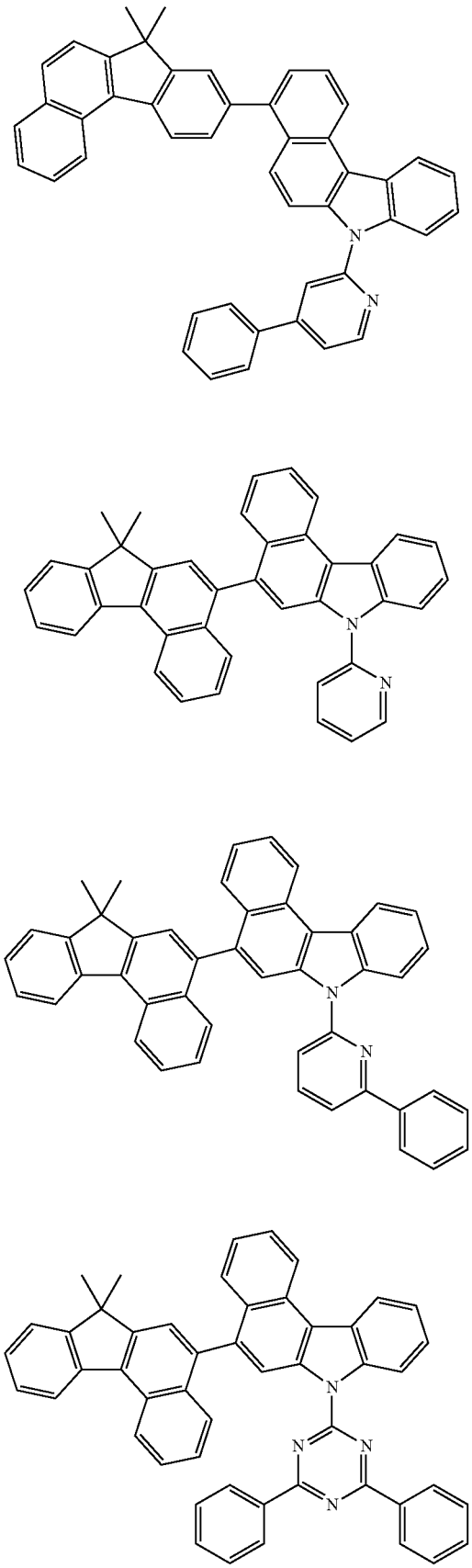

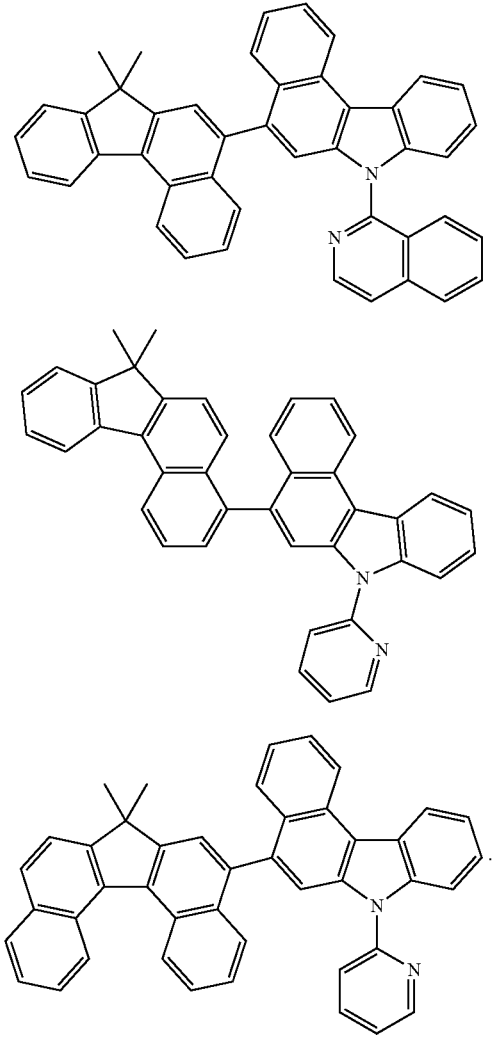

14. The carbazole-based compound of claim 1, wherein the substituted $C_3$-$C_{10}$ cycloalkylene group, the substituted $C_3$-$C_{10}$ heterocycloalkylene group, the substituted $C_2$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_3$-$C_{10}$ heterocycloalkyl group, the substituted $C_2$-$C_{10}$ cycloalkenyl group, the substituted $C_2$-$C_{10}$ heterocycloalkenyl group, the substituted $C_6$-$C_{60}$ aryl group, and the substituted $C_2$-$C_{60}$ heteroaryl group includes at least one substituent, the substituent being:
  a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group; or
  a $C_1$-$C_{60}$ alkyl group, a $C_2$-$C_{60}$ alkenyl group, a $C_2$-$C_{60}$ alkynyl group, or a $C_1$-$C_{60}$ alkoxy group, each of which is substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group; or a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group, each of which is substituted with a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a phenanthrenyl group, a chrysenyl group, a carbazolyl group, a pyridinyl group, a pyrimidinyl group, a pyrazinyl group, a triazinyl group, a quinolyl group, or an isoquinolyl group; or —$N(Q_{11})(Q_{12})$ or —$Si(Q_{ii})(Q_{12})(Q_{13})$ wherein $Q_{11}$ and $Q_{12}$ are each independently a $C_6$-$C_{60}$ aryl group or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group.

15. An organic light-emitting diode, comprising:
a first electrode;
a second electrode facing the first electrode; and
an organic layer between the first electrode and the second electrode, the organic layer comprising an emission layer and at least one carbazole-based compound according to claim 1.

16. The organic light emitting diode of claim 15, wherein the organic layer further comprises at least one of a hole injection layer, a hole transport layer, a functional layer having both hole injecting and hole transporting capabilities, a buffer layer, or an electron blocking layer between the first electrode and the emission layer, and wherein the organic layer further comprises at least one of a hole blocking layer, an electron transport layer, and an electron injection layer between the emission layer and the second electrode.

17. The organic light emitting diode of claim 15, wherein the carbazole-based compound is in the emission layer, the carbazole-based compound is a host, and the emission layer further comprises a dopant.

* * * * *